(12) United States Patent
Liu et al.

(10) Patent No.: US 11,821,080 B2
(45) Date of Patent: Nov. 21, 2023

(54) REAGENTS TO REMOVE OXYGEN FROM METAL OXYHALIDE PRECURSORS IN THIN FILM DEPOSITION PROCESSES

(71) Applicants: L'Air Liquide, Société Anonyme pour l'Etude et l'Exploitation des Procédés Georges Claude, Paris (FR); American Air Liquide, Inc., Fremont, CA (US)

(72) Inventors: Yumin Liu, San Jose, CA (US); Rocio Alejandra Arteaga Muller, Yokosuka (JP); Nicolas Blasco, Grenoble (FR); Jean-Marc Girard, Versailles (FR); Feng Li, San Jose, CA (US); Venkateswara R. Pallem, Hockessin, DE (US); Zhengning Gao, Yokohama (JP)

(73) Assignee: L'Air Liquide Societe Anonyme Pour L'Etude Et L'Exploitation Des Procedes Georges Claude, Paris (FR)

( * ) Notice: Subject to any disclaimer, the term of this patent is extended or adjusted under 35 U.S.C. 154(b) by 0 days.

(21) Appl. No.: 17/193,046

(22) Filed: Mar. 5, 2021

(65) Prior Publication Data
US 2021/0277517 A1    Sep. 9, 2021

Related U.S. Application Data

(60) Provisional application No. 62/985,627, filed on Mar. 5, 2020.

(51) Int. Cl.
C23C 16/06    (2006.01)
C23C 16/34    (2006.01)
(Continued)

(52) U.S. Cl.
CPC .............. *C23C 16/34* (2013.01); *C23C 16/06* (2013.01); *C23C 16/45553* (2013.01); *H01L 21/0228* (2013.01); *H01L 21/02172* (2013.01)

(58) Field of Classification Search
CPC .... C23C 16/34; C23C 16/06; C23C 16/45553
See application file for complete search history.

(56) References Cited

U.S. PATENT DOCUMENTS 4,668,528 A    5/1987    Ehrlich et al.
9,960,033 B1    5/2018    Nozawa
(Continued)

FOREIGN PATENT DOCUMENTS

JP    2000 114369    10/1998
JP    2021 120472    8/2021
(Continued)

OTHER PUBLICATIONS

Davies, Alloy selection for service in chlorine, hydrogen chloride and hydrochloric acid, a guide to the use of nickel-containing alloys, Nickel Institute, downloaded from https://nickelinstitute.org/media/3795/nickelpub10020_12pgdec03final.pdf on Mar. 5, 2020, 12 pages.
(Continued)

*Primary Examiner* — Elizabeth A Burkhart
(74) *Attorney, Agent, or Firm* — Yan Jiang

(57) ABSTRACT

A process for gas phase deposition of a metal or metal nitride film on a surface substrate comprises: reacting a metal-oxo or metal oxyhalide precursor with an oxophilic reagent in a reactor containing the substrate to deoxygenate the metal-oxo or metal oxyhalide precursor, and forming the metal or metal nitride film on the substrate through a vapor deposition process. The substrate is exposed to the metal oxyhalide precursor and the oxophilic reagent simultaneously or sequentially. The substrate is exposed to a reducing agent sequentially after deoxygenation.

19 Claims, 6 Drawing Sheets

(51) Int. Cl.
*C23C 16/455* (2006.01)
*H01L 21/02* (2006.01)

(56) References Cited

U.S. PATENT DOCUMENTS

| | | |
|---|---|---|
| 10,510,590 B2 | 12/2019 | Thombare et al. |
| 10,553,023 B2 | 1/2020 | Winter et al. |
| 2003/0022065 A1 | 1/2003 | Zhang et al. |
| 2007/0049045 A1 | 3/2007 | Zimmerman et al. |
| 2015/0004804 A1* | 1/2015 | Orihashi ............ H01L 21/0228 118/704 |
| 2017/0062224 A1* | 3/2017 | Fu ........................ C23C 16/06 |
| 2018/0286668 A1 | 10/2018 | Baum et al. |
| 2019/0067003 A1 | 2/2019 | Zope et al. |
| 2019/0067094 A1* | 2/2019 | Zope ................ H01L 23/53266 |
| 2019/0368039 A1 | 12/2019 | Arteaga et al. |
| 2020/0131628 A1 | 4/2020 | Baum et al. |
| 2021/0057223 A1 | 2/2021 | Stevens et al. |
| 2021/0242026 A1 | 8/2021 | Kuribayashi et al. |

FOREIGN PATENT DOCUMENTS

| | | |
|---|---|---|
| WO | WO 2019 209289 | 10/2019 |
| WO | WO 2020 023790 | 1/2020 |

OTHER PUBLICATIONS

Gäggeler, H.W., Online gas chemistry experiments with transactinide elements, J. Radioanal. Nucl. Chem., 1994, 183, 261-271.

Kepp, K.P., A quantitative scale of oxophilicity and thiophilicity, Inorg. Chem. 2016, 55, 9461-9470.

International Search Report and Written Opinion for corresponding PCT/US2022/018899, dated Jun. 7, 2022.

* cited by examiner

REAGENTS TO REMOVE OXYGEN FROM METAL OXYHALIDE PRECURSORS IN THIN FILM DEPOSITION PROCESSES

CROSS REFERENCE TO RELATED APPLICATIONS

This application claims the benefit of priority to U.S. Provisional Patent Application No. 62/985,627, filed Mar. 5, 2020, the entire contents of which are incorporated herein by reference Technical Field The present invention relates to methods of using a highly oxophilic compound as a reagent to deoxygenate a metal oxyhalide precursor or remove oxygen from intermediate films formed by deposition of a metal oxyhalide precursor in ALD and CVD processes, and in particular, to the usage of such reagent facilitates deoxygenation to reduce the temperature at which the ALD or CVD takes place to yield a metal or a metal nitride film with low oxygen content.

BACKGROUND

Many transition metal (such as W, Mo, Cr, V . . . ) oxyhalides are volatile and thermally stable, and may be used as precursors for atomic layer deposition (ALD) and chemical vapor deposition (CVD) processes to deposit pure metal or metal nitride films through cleavage of M-X and M=O bonds. Numerous examples include US 20170062224, US 20180286668, WO 2019209289, US 20200131628, US 20070049045A, US 20030022065A, U.S. Ser. No. 10/510, 590B2, US 20190067003A and U.S. Pat. No. 4,668,528A. However, complete removal of oxygen containing species, i.e. cleavage of the M=O bonds, during the ALD/CVD process is a challenge and properties of the deposited films depend heavily on the success removal of surficial impurities, such as oxygen atoms in this case.

Hydrogen and hydride compounds (of Si, B, P, Al notably) are powerful reducing reagent that may remove the oxygen from the metal oxyhalides, and produce water as the volatile byproduct. However, the reduction of the M=O bond by $H_2$ or hydride typically occurs at high temperature (e.g., >500° C.), which is incompatible with certain applications where the substrate on which the film is deposited cannot withstand such high temperature. Additionally, the reduction of a transition metal oxyhalide by hydrogen or hydride leads to the formation of hydrogen halide (e.g., HCl) and water, which creates a highly corrosive gaseous environment for a processing chamber and downstream equipment, such as, vacuum line, pumps, pressure regulating valves, and the like. In parallel, water as a byproduct could react with surficial metal oxyhalide or metal halide intermediates, and leave oxygen contamination. Davis (Davies M., Alloy Selection for Service in Chlorine, Hydrogen Chloride and Hydrochloric Acid, 2019, $2^{nd}$ Edition) describes such impacts. Some metal or semi-metal hydrides such as $AlH_3$, $B_2H_6$, $PH_3$, $SiH_4$, $Si_2H_6$ are also potent reducing agents, but the reaction products with oxygen atoms generally leads to the formation of non-volatile metal or semi-metal oxides ($Al_2O_3$, $B_2O_3$, $SiO_2$ . . . ). As such, such metal or semi-metal hydrides are not appropriate as co-reactants with metal oxyhalide precursors.

Applications of Mo film have gained an accelerated interest to substitute some layers especially in middle-of-line (MOL) or backend-of-the-line (BEOL) requiring to have processes below 500° C. while depositing highly pure films. $MoF_6$, $MoCl_5$, $MoOCl_4$, $MoO_2Cl_2$ are well known inorganic precursors to deposit pure Mo films when combined with reducing reagents, such as $H_2$. $MoO_2Cl_2$ has been reported to be the less corrosive between these groups of precursors, and is the one with a higher vapor pressure. The lowest temperature to deposit Mo film by ALD $MoO_2Cl_2/H_2$ is at least 500° C. mainly due to the difficulty to remove the double bonds between oxygen and molybdenum.

U.S. Ser. No. 10/533,023 discloses the formation of metal films from "metalorganic" precursors and a reducing agent, in which a first compound having an atom in an oxidized state is reacted with a bis(trimethylsilyl) six-membered ring system or related compound to form a second compound having the atom in a reduced state relative to the first compound. The atom in an oxidized state is selected from the group consisting of Groups 2-12 of the Periodic Table, the lanthanides, As, Sb, Bi, Te, Si, Ge, Sn, and Al.

WO 2020/023790 discloses deposition of pure metal films use $MoOCl_4$, $MoO_2Cl_2$, with 1:100-10000 ratios $H_2$ as a reducing gas at high temperature of 500° C. to deposit Mo with ≤1 atomic % oxygen residue. For W film, $WOF_4$, $WOCl_4$, $WO_2Cl_2$, etc. are used.

U.S. Ser. No. 10/510,590 discloses low resistance metallization stack structures for logic and memory applications and related methods of fabrication, in which a Mo-containing layer was deposited on a W-containing layer using ALD/CVD. The Mo-containing layer is deposited by exposing the W-containing layer to a reducing agent and the Mo-containing precursor selected from: $MoF_6$, $MoCl_5$, $MoO_2Cl_2$, $MoOCl_4$, and $Mo(CO)_6$. The process temperature ranges from 300° C. to 700° C.

Thus, lowering the temperature of the deposition process has been challenging.

SUMMARY

Disclosed is a method for deposition of a metal or metal nitride film on a substrate, the process comprising
reacting a metal oxyhalide precursor with an oxophilic reagent in a reactor containing the substrate to deoxygenate the metal oxyhalide precursor; and
forming the metal or metal nitride film on the substrate through a vapor deposition process. The disclosed method may include one or more of the following aspects:
- further comprising exposing the substrate to the metal oxyhalide precursor and the oxophilic reagent simultaneously;
- further comprising exposing the substrate to the metal oxyhalide precursor and the oxophilic reagent sequentially;
- further comprising exposing the substrate to a reducing agent sequentially after deoxygenation;
- the metal oxyhalide precursor being $M^{(a)}X_cO_e$, wherein M is Mo, W, V, Nb, Ta, and Cr; X is a halogen selected from Cl, Br or I; a is the oxidation state of M and a is an integer ranging from 3 to 6; c is a number, 0<c<6; e is a number, 0<e<3; c+2e=a;
- the oxophilic reagent being $N^{(b)}X_dO_f$, wherein N is a transition metal halide or oxyhalide, or a Group 14 or 15 halide, oxyhalide or oxide; X is a halogen selected from Cl, Br or I; b is the oxidation state of N and b is an integer ranging from 3 to 6; d is a number, 0≤d<6; f is a number, 0<f<3; d+2f=b;
- oxophilicity of N being larger than oxophilicity of M;
- the metal oxyhalide precursor being selected from the group consisting of $MoO_2Cl_2$, $MoOCl_4$, $WOCl_4$, $WO_2Cl_2$, $NbOCl_3$, $TaOCl_3$, and $CrO_2Cl_2$;

the metal oxyhalide precursor being $MoO_2Cl_2$;

the metal oxyhalide precursor being a metal-oxo precursor;

the metal oxyhalide precursor being an oxygen-containing metal precursor;

the oxophilic reagent and their oxidized product being volatile;

the oxophilic reagent being volatile;

the oxophilic reagent's oxidized product being volatile;

no trace of the elements of the oxophilic reagent and its oxidized products being left on the surface of deposition films;

the oxophilic reagent being selected from a Group 14-containing or Group 15-containing halide, oxyhalide or oxide;

the oxophilic reagent being selected from a Group 14-containing or Group 15-containing halide;

the oxophilic reagent being selected from a Group 14-containing or Group 15-containing oxyhalide;

the oxophilic reagent being selected from a Group 14-containing or Group 15-containing oxide;

the oxophilic reagent being selected from a transition metal-containing halides or oxyhalides;

the oxophilic reagent being selected from a transition metal-containing halides;

the oxophilic reagent being selected from a transition metal-containing oxyhalides;

the oxophilic reagent being selected from;
  a. Group 14-containing: $CCl_4$; $CBr_4$; $COCl_2$; CO; R—N=C=O, wherein R is H, or an alkyl group selected from H, Me, Et, iPr, nPr, iBu, tBu, sBu, nBu; or $Si_xR_yX_z$, wherein x=1 to 5, y and z=0 to 12, y+z≤2x+2; X is a halogen selected from Cl, Br, I; R is H, a saturated or unsaturated hydrocarbon group, amino group, alkoxy group, or silyl group;
  b. Group 15-containing: NO, $N_2O$, $PCl_3$, $PBr_3$, $PI_3$; or
  c. Transition metal-containing: $VCl_4$, $VCl_3$, $NbCl_5$, $TaCl_5$, $WCl_6$, $WCl_5$, $WOCl_4$, or $WCl_4$;

the oxophilic reagent being a Si-containing oxophilic reagent having a general formula $Si_xR_yX_z$, wherein x=1 to 5, y and z=0 to 12, y+z≤2x+2; X is a halogen selected from Cl, Br, I; R is H, a saturated or unsaturated carbon-containing ligand, nitrogen-containing ligand, oxygen-containing ligand, silicon-containing ligand;

the oxophilic reagent being a Si-containing oxophilic reagent having a general formula $Si_xR_yX_z$, wherein x=1 to 5, y and z=0 to 12, y+z≤2x+2; X is a halogen selected from Cl, Br, I; R is H, a saturated or unsaturated hydrocarbon group, amino group, alkoxy group, or silyl group;

the Si-containing oxophilic reagent being selected from $Si_2Cl_8$, $Si_2Cl_5H$, $Si_2Cl_4Me_2$, $Si_2ClMe_5$, $Si_2Cl_2Me_4$, $Si_2Br_6$, $Si_2Br_6H$, $Si_2Br_4Me_2$, $Si_2BrMe_5$, $Si_2Br_2Me_4$, $Si_2Br_5H$, $Si_2Me_6$, $Si_2I_6$, $Si_2I_5H$, $Si_2I_4(Me)_2$, $Si_2(OMe)_6$, $Si_2(NR_2)_6$ (wherein R=H, Me, Et), $Si_2(NMe_2)_5Cl$, $Si_3Cl_8$, $Si_3Br_8$, $Si_3I_8$, or $Si_4(Me)_8H$;

the oxophilic reagent being $Si_2Cl_6$ (HCDS);

the oxophilic reagent being a nonhalogen-containing oxophilic reagent selected from:
  Group 14-containing: CO, R—N=C=O, wherein R is H, or an alkyl group selected from H, Me, Et, iPr, nPr, iBu, tBu, sBu, nBu; or
  Group 15: NO, $N_2O$;

the oxophilic reagent being R—N=C=O, wherein R is H, or an alkyl group selected from H, Me, Et, iPr, nPr, iBu, tBu, sBu, nBu, which leads to form the metal nitride film;

the oxophilic reagent being tBu-N=C=O;

the oxophilic reagent being a metal halide or metal oxyhalide selected from $VCl_4$, $VCl_3$, $NbCl_5$, $TaCl_5$, $WCl_6$, $WCl_5$, $WOCl_4$, or $WCl_4$;

the oxophilic reagent being $WCl_4$, $WCl_5$, or $WCl_6$;

the oxophilic reagent being volatile;

products of the oxophilic reagent being volatile;

the reducing agent being $H_2$ or $B_2H_6$;

the reducing agent being $H_2$;

the reducing agent being $NH_3$;

the reducing agent being the oxophilic reagent selected from CO, $SiHCl_3$, $SiHBr_3$, or $SiHI_3$;

a deposition temperature ranging from 50° C. to 500° C.;

a deposition temperature ranging from 100° C. to 500° C.;

a deposition temperature ranging from 150° C. to 485° C.;

a deposition temperature being less than 500° C.;

a deposition temperature being less than 485° C.;

a purity in the metal or metal nitride film being larger than approximately 98.5%;

a purity in the metal or metal nitride film being larger than approximately 99%;

an oxygen impurity in the metal or metal nitride film being less than approximately 1%;

an oxygen impurity in the metal or metal nitride film being less than 1.5%;

a silicon impurity in the metal or metal nitride film being 0%;

a silicon impurity in the metal or metal nitride film being approximately 0%;

the metal oxyhalide precursor having a purity ranging from approximately 93% w/w to approximately 100% w/w;

the metal oxyhalide precursor having a purity ranging from approximately 99% w/w to approximately 99.999% w/w;

the oxophilic reagent having a purity ranging from approximately 93% w/w to approximately 100% w/w;

the oxophilic reagent having a purity ranging from approximately 99% w/w to approximately 99.999% w/w;

the reducing agent having a purity ranging from approximately 93% w/w to approximately 100% w/w;

the reducing agent having a purity ranging from approximately 99% w/w to approximately 99.999% w/w;

the vapor deposition process being a thermal CVD;

the vapor deposition process being a thermal ALD;

the vapor deposition process being a plasma enhanced CVD;

the vapor deposition process being a plasma enhanced ALD; and the vapor deposition process being a spatial ALD.

Also disclosed is a method for removing oxygen from a metal oxyhalide precursor or an intermediate film deposited by the metal oxyhalide precursor to form a metal or metal nitride film on a surface, the process comprising reacting the metal oxyhalide precursor or the intermediate film deposited by the metal oxyhalide precursor with an oxophilic reagent to form a metal intermediate; and reducing the metal intermediate to a metal or metal nitride film on the surface by a reducing agent through a vapor deposition process, wherein the metal oxyhalide precursor is $M^{(a)}X_cO_e$, wherein M is Mo, W, V, Nb, Ta, and Cr; X is a halogen selected from Cl, Br or I; a is the oxidation state of M and a is an integer ranging from 3 to 6; c is a number, $0<c<6$; e is a number, $0<e<3$; c+2e=a; and the oxophilic reagent is $N^{(b)}X_dO_f$, wherein N is a transition metal halide or oxyhalide, or a Group 14 or 15 halide, oxyhalide or oxide; X is a halogen selected from Cl, Br or I; b is the oxidation state of N and b is an integer ranging from 3 to 6; d is a number, 0≤d<6; f is a number, 0<f<3; d+2f=b, wherein oxophilicity of N is higher than oxophilicity of M, wherein the oxophilic reagent and deoxygenation products of the oxophilic reagent are volatile. The disclosed method may include one or more of the following aspects:
 the metal oxyhalide precursor being selected from $MoO_2Cl_2$, $MoOCl_4$, $WOCl_4$, $WO_2Cl_2$, $NbOCl_3$, $TaOCl_3$, and $CrO_2Cl_2$;
 the oxophilic reagent being selected from:
  a. Group 14-containing: $CCl_4$; $CBr_4$; $COCl_2$; CO; R—N=C=O, wherein R is H, or an alkyl group selected from H, Me, Et, iPr, nPr, iBu, tBu, sBu, nBu; or $Si_xR_yX_z$, wherein x=1 to 5, y and z=0 to 12, y+z≤2x+2, X is a halogen selected from Cl, Br, I, R is H, a saturated or unsaturated hydrocarbon group, amino group, alkoxy group, or silyl group;
  b. Group 15-containing: NO, $N_2O$, $PCl_3$, $PBr_3$, $PI_3$; or
  c. Transition metal-containing: $VCl_4$, $VCl_3$, $NbCl_5$, $TaCl_5$, $WCl_6$, $WCl_5$, $WOCl_4$, or $WCl_4$;
 the oxophilic reagent being a Si-containing oxophilic reagent having a general formula $Si_xR_yX_z$, wherein x=1 to 5, y and z=0 to 12, y+z≤2x+2; X is a halogen selected from Cl, Br, I; R is H, a saturated or unsaturated hydrocarbon group, amino group, alkoxy group, or silyl group;
 the Si-containing oxophilic reagent being selected from $Si_2Cl_6$, $Si_2Cl_5H$, $Si_2Cl_4Me_2$, $Si_2ClMe_5$, $Si_2Cl_2Me_4$, $Si_2Br_6$, $Si_2Br_5H$, $Si_2Br_4Me_2$, $Si_2BrMe_5$, $Si_2Br_2Me_4$ $Si_2Br_5H$, $Si_2Me_6$, $Si_2I_6$, $Si_2I_5H$, $Si_2I_4(Me)_2$, $Si_2(OMe)_6$, $Si_2(NR_2)_6$ (wherein R=H, Me, Et), $Si_2(NMe_2)_5Cl$, $Si_3Cl_8$, $Si_3Br_8$, $Si_3I_8$, or $Si_4(Me)_9H$;
 the oxophilic reagent being $Si_2Cl_8$ (HCDS);
 the oxophilic reagent being a nonhalogen-containing oxophilic reagent selected from:
  Group 14-containing: CO, R—N=C=O, wherein R is H, or an alkyl group selected from H, Me, Et, iPr, nPr, iBu, tBu, sBu, nBu; or
  Group 15: NO, $N_2O$;
 the oxophilic reagent being R—N=C=O, wherein R is H, or an alkyl group selected from H, Me, Et, iPr, nPr, iBu, tBu, sBu, nBu, which leads to form the metal nitride film;
 the oxophilic reagent being tBu-N=C=O;
 the oxophilic reagent being a metal halide or metal oxyhalide selected from $VCl_4$, $VCl_3$, $NbCl_5$, $TaCl_5$, $WCl_6$, $WCl_5$, $WOCl_4$, or $WCl_4$;
 the oxophilic reagent being $WCl_4$, $WCl_5$ or $WCl_6$;
 the oxophilic reagent being volatile;
 products of the oxophilic reagent being volatile;
 the reducing agent being $H_2$ or $B_2H_6$;
 the reducing agent being $H_2$;
 the reducing agent being $NH_3$;
 the reducing agent being the oxophilic reagent selected from CO, $SiHCl_3$, $SiHBr_3$, or $SiHI_3$;
 an oxygen impurity in the metal or metal nitride film being less than approximately 1%;
 the vapor deposition process being a thermal CVD or ALD, or a plasma enhanced CVD or ALD;
 a deposition temperature ranging from 50° C. to 500° C.;
 a deposition temperature ranging from 100° C. to 500° C.;
 a deposition temperature ranging from 150° C. to 485° C.;
 a deposition temperature being less than 500° C.; and
 a deposition temperature being less than 485° C.

Also disclosed is a reagent for deoxygenation of a metal oxyhalide precursor or an intermediate film deposited by the metal oxyhalide precursor to form a metal or metal nitride film in a vapor deposition process, the metal oxyhalide precursor having a general formula: $M^{(a)}X_cO_e$, wherein M is Mo, W, V, Nb, Ta, and Cr; X is a halogen selected from Cl, Br or I; a is the oxidation state of M and a is an integer ranging from 3 to 6; c is a number, 0<c<6; e is a number, 0<e<3; c+2e=a, the reagent comprising:
 an oxophilic reagent having a general formula: $N^{(b)}X_dO_f$, wherein N is a transition metal halide or oxyhalide, or a Group 14 or 15 halide, oxyhalide or oxide; X is a halogen selected from Cl, Br or I; b is the oxidation state of N and b is an integer ranging from 3 to 6; d is a number, 0≤d<6; f is a number, 0<f<3; d+2f=b, wherein oxophilicity of N of the oxophilic reagent is higher than oxophilicity of M of the metal oxyhalide precursor, wherein the oxophilic reagent and deoxygenation products of the oxophilic reagent are volatile. The disclosed reagent may include one or more of the following aspects:
 the metal oxyhalide precursor being selected from $MoO_2Cl_2$, $MoOCl_4$, $WOCl_4$, $WO_2Cl_2$, $NbOCl_3$, $TaOCl_3$, and $CrO_2Cl_2$;
 the oxophilic reagent being selected from:
  a. Group 14-containing: $CCl_4$; $CBr_4$; $COCl_2$; CO; R—N=C=O, wherein R is H, or an alkyl group selected from H, Me. Et, iPr, nPr, iBu, tBu, sBu, nBu; or $Si_xR_yX_z$, wherein x=1 to 5, y and z=0 to 12, y+z≤2x+2, X is a halogen selected from Cl, Br, I, R is H, a saturated or unsaturated hydrocarbon group, amino group, alkoxy group, or silyl group;
  b. Group 15-containing: NO, $N_2O$, $PCl_3$, $PBr_3$, $PI_3$; or
  c. Transition metal-containing: $VCl_4$, $VCl_3$, $NbCl_5$, $TaCl_5$, $WCl_6$, $WCl_5$, $WOCl_4$, or $WCl_4$;
 the oxophilic reagent being a Si-containing oxophilic reagent having a general formula: $Si_xR_yX_z$, wherein x=1 to 5, y and z=0 to 12, y+z≤2x+2; X is a halogen selected from Cl, Br, I; R is H, a saturated or unsaturated hydrocarbon group, amino group, alkoxy group, or silyl group;
 the Si-containing oxophilic reagent being selected from $Si_2Cl_6$, $Si_2Cl_5H$, $Si_2Cl_4Me_2$, $Si_2ClMe_5$, $Si_2Cl_2Me_4$, $Si_2Br_6$, $Si_2Br_5H$, $Si_2Br_4Me_2$, $Si_2BrMe_5$, $Si_2Br_2Me_4$ $Si_2Br_5H$, $Si_2Me_6$, $Si_2I_6$, $Si_2I_5H$, $Si_2I_4(Me)_2$, $Si_2(OMe)_6$, $Si_2(NR_2)_6$ (wherein R=H, Me, Et), $Si_2(NMe_2)_5Cl$, $Si_3Cl_8$, $Si_3Br_8$, $Si_3I_8$, or $Si_4(Me)_9H$;
 the oxophilic reagent being $Si_2Cl_6$;
 the oxophilic reagent being $WCl_4$, $WCl_5$ or $WCl_6$;
 the oxophilic reagent being R—N=C=O, wherein R is H, or an alkyl group selected from H, Me, Et, iPr, nPr, iBu, tBu, sBu, nBu, which leads to form the metal nitride film;
 the oxophilic reagent being tBu-N=C=O;
 the oxophilic reagent being a metal halide or metal oxyhalide selected from $VCl_4$, $VCl_3$, $NbCl_5$, $TaCl_5$, $WCl_6$, $WCl_5$, $WOCl_4$, or $WCl_4$;
 the oxophilic reagent being volatile;
 deoxygenation products of the oxophilic reagent being volatile;
 the oxophilic reagent having a purity ranging from approximately 93% w/w to approximately 100% w/w;

the oxophilic reagent having a purity ranging from approximately 99% w/w to approximately 99.999% w/w; and the oxophilic reagent having a water impurity less than 20 ppm by weight.

Notation and Nomenclature

The following detailed description and claims utilize a number of abbreviations, symbols, and terms, which are generally well known in the art, and include:

As used herein, the indefinite article "a" or "an" means one or more.

As used herein, "about" or "around" or "approximately" in the text or in a claim means±10% of the value stated.

As used herein, "room temperature" in the text or in a claim means from approximately 20° C. to approximately 25° C.

The standard abbreviations of the elements from the periodic table of elements are used herein. It should be understood that elements might be referred to by these abbreviation (e.g., Si refers to silicon, N refers to nitrogen, O refers to oxygen, C refers to carbon, H refers to hydrogen, F refers to fluorine, etc.).

The unique CAS registry numbers (i.e., "CAS") assigned by the Chemical Abstract Service are provided to help better identify the molecules disclosed.

As use herein, the formula "$M^{(a)}X_cO_e$" refers to a metal oxyhalide precursor, wherein M is Mo, W, V, Nb, Ta, and Cr; X is a halogen selected from Cl, Br or I; a is the oxidation state of M and a is an integer ranging from 3 to 6; c is a number, $0<c<6$; e is a number, $0<e<3$; c+2e=a.

As used herein, the formula "$N^{(b)}X_dO_f$" refers to an oxophilic reagent, wherein N is a transition metal halide or oxyhalide, or a Group 14 or 15 halide, oxyhalide or oxide; X is a halogen selected from Cl, Br or I; b is the oxidation state of N and b is an integer ranging from 3 to 6; d is a number, $0≤d<6$; f is a number, $0<f<3$; d+2f=b.

As used herein, the formula "$Si_xR_yY_z$" refers to Si-containing oxophilic reagent, wherein x=1 to 5, y and z=0 to 12, y+z≤2x+2; X is a halogen selected from Cl, Br, I; R is H, a saturated or unsaturated hydrocarbon group, amino group, alkoxy group, or silyl group.

As used herein, the formula "M-X" refers to metal halides where M is metal, X is halogen element selected from Cl, Br, or I.

As used herein, the formula "$MN_x$" refers to metal nitride, where M is metal, N is nitrogen, x is a positive number ranging $0<x≤2$, but not necessarily an integer.

As use herein, the formula "$MO_x$" refers to metal oxide, where M is metal, O is oxygen, x is a positive number ranging $0<x≤3$, but not necessarily an integer.

As use herein, the formula "$MO_xX_y$" refers to metal oxygen halide, where M is metal, O is oxygen, X is Cl, Br or I, x is a number ranging $0<x≤3$, y is a number ranging $0<y≤6$, $2x+y≤6$. x and y each are not necessarily an integer.

As use herein, the formula "R—N=C=O" refers to an isocynate, wherein R is a saturated or unsaturated hydrocarbon group, such as an alkyl group, preferably, R=H, Me, Et, iPr, nPr, iBu, tBu, sBu, nBu.

As used herein, the term "hydrocarbon" refers to a saturated or unsaturated function group containing exclusively carbon and hydrogen atoms.

As used herein, the term "alkyl group" refers to saturated functional groups containing exclusively carbon and hydrogen atoms. An alkyl group is one type of hydrocarbon. Further, the term "alkyl group" refers to linear, branched, or cyclic alkyl groups. Examples of linear alkyl groups include without limitation, methyl groups, ethyl groups, propyl groups, butyl groups, etc. Examples of branched alkyls groups include without limitation, t-butyl. Examples of cyclic alkyl groups include without limitation, cyclopropyl groups, cyclopentyl groups, cyclohexyl groups, etc.

As used herein, the abbreviation "Me" refers to a methyl group; the abbreviation "Et" refers to an ethyl group; the abbreviation "Pr" refers to a propyl group (i.e., n-propyl or isopropyl); the abbreviation "iPr" refers to an isopropyl group; the abbreviation "Bu" refers to any butyl group (n-butyl, iso-butyl, tertButyl, sec-butyl); the abbreviation "tBu" refers to a tertButyl group; the abbreviation "sBu" refers to a sec-butyl group; the abbreviation "iBu" refers to an iso-butyl group; the abbreviation "Ph" refers to a phenyl group.

The term "substrate" refers to a material or materials on which a process is conducted. The substrate may refer to a wafer having a material or materials on which a process is conducted. The substrates may be any suitable wafer used in semiconductor, photovoltaic, flat panel, or LCD-TFT device manufacturing. The substrate may also have one or more layers of differing materials already deposited upon it from a previous manufacturing step. For example, the wafers may include silicon layers (e.g., crystalline, amorphous, porous, etc.), silicon containing layers (e.g., $SiO_2$, SiN, SiON, SiCOH, etc.), metal containing layers (e.g., copper, cobalt, ruthenium, tungsten, platinum, palladium, nickel, gold, etc.), an organic layer such as amorphous carbon, or a photoresist, or combinations thereof. Furthermore, the substrate may be planar or patterned. The substrate may include layers of oxides which are used as dielectric materials in MEMS, 3D NAND, MIM, DRAM, or FeRam device applications (for example, $ZrO_2$ based materials, $HfO_2$ based materials, $TiO_2$ based materials, rare earth oxide based materials, ternary oxide based materials, etc.) or nitride-based films (for example, TaN, TiN, NbN) that are used as electrodes. One of ordinary skill in the art will recognize that the terms "film" or "layer" used herein refer to a thickness of some material laid on or spread over a surface and that the surface may be a trench or a line. Throughout the specification and claims, the wafer and any associated layers thereon are referred to as substrates.

Note that herein, the terms "oxygen scavenger" and "oxygen removal" and "deoxygenation" may be used interchangeably. It is understood that an oxygen scavenger may correspond to, or be related to an oxygen removal or deoxygenation, and that the oxygen removal or deoxygenation may refer to the oxygen scavenger.

Note that herein, the terms "film" and "layer" may be used interchangeably. It is understood that a film may correspond to, or related to a layer, and that the layer may refer to the film. Furthermore, one of ordinary skill in the art will recognize that the terms "film" or "layer" used herein refer to a thickness of some material laid on or spread over a surface and that the surface may range from as large as the entire wafer to as small as a trench or a line.

Note that herein, the terms "aperture", "gap", "via", "hole", "opening", "trench" and "structure" may be used interchangeably to refer to an opening formed in a semiconductor substrate.

Note that herein, the terms "deposition temperature", "substrate temperature" and "process temperature" may be used interchangeably. It is understood that a substrate temperature may correspond to, or be related to a deposition temperature or a process temperature, and that the deposition temperature or process temperature may refer to the substrate temperature.

Note that herein, the terms "precursor" and "deposition compound" and "deposition gas" may be used interchangeably when the precursor is in a gaseous state at room temperature and ambient pressure. It is understood that a precursor may correspond to, or be related to a deposition compound or deposition gas, and that the deposition compound or deposition gas may refer to the precursor.

As used herein, the abbreviation "NAND" refers to a "Negated AND" or "Not AND" gate; the abbreviation "2D" refers to 2 dimensional gate structures on a planar substrate; the abbreviation "3D" refers to 3 dimensional or vertical gate structures, wherein the gate structures are stacked in the vertical direction.

Ranges may be expressed herein as from about one particular value, and/or to about another particular value. When such a range is expressed, it is to be understood that another embodiment is from the one particular value and/or to the other particular value, along with all combinations within said range. Any and all ranges recited in the disclosed embodiments are inclusive of their endpoints (i.e., x=1 to 4 or x ranges from 1 to 4 includes x=1, x=4, and x=any number in between), irrespective of whether the term "inclusively" is used.

Reference herein to "one embodiment" or "an embodiment" means that a particular feature, structure, or characteristic described in connection with the embodiment may be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

"Comprising" in a claim is an open transitional term which means the subsequently identified claim elements are a nonexclusive listing i.e. anything else may be additionally included and remain within the scope of "comprising." "Comprising" is defined herein as necessarily encompassing the more limited transitional terms "consisting essentially of" and "consisting of"; "comprising" may therefore be replaced by "consisting essentially of" or "consisting of" and remain within the expressly defined scope of "comprising".

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

BRIEF DESCRIPTION OF THE DRAWINGS

For a further understanding of the nature and objects of the present invention, reference should be made to the following detailed description, taken in conjunction with the accompanying drawings, in which like elements are given the same or analogous reference numbers and wherein:

as shown in FIG. 2a with HCDS as an oxygen scavenger and $H_2$ as the reducing agent in accordance with an exemplary embodiment of the present invention;

as shown in FIG. 3a with $H_2$ as the reducing agent in the absence of HCDS as oxygen scavenger in accordance with an exemplary embodiment of the present invention.

DESCRIPTION OF PREFERRED EMBODIMENTS

Figure 1A:
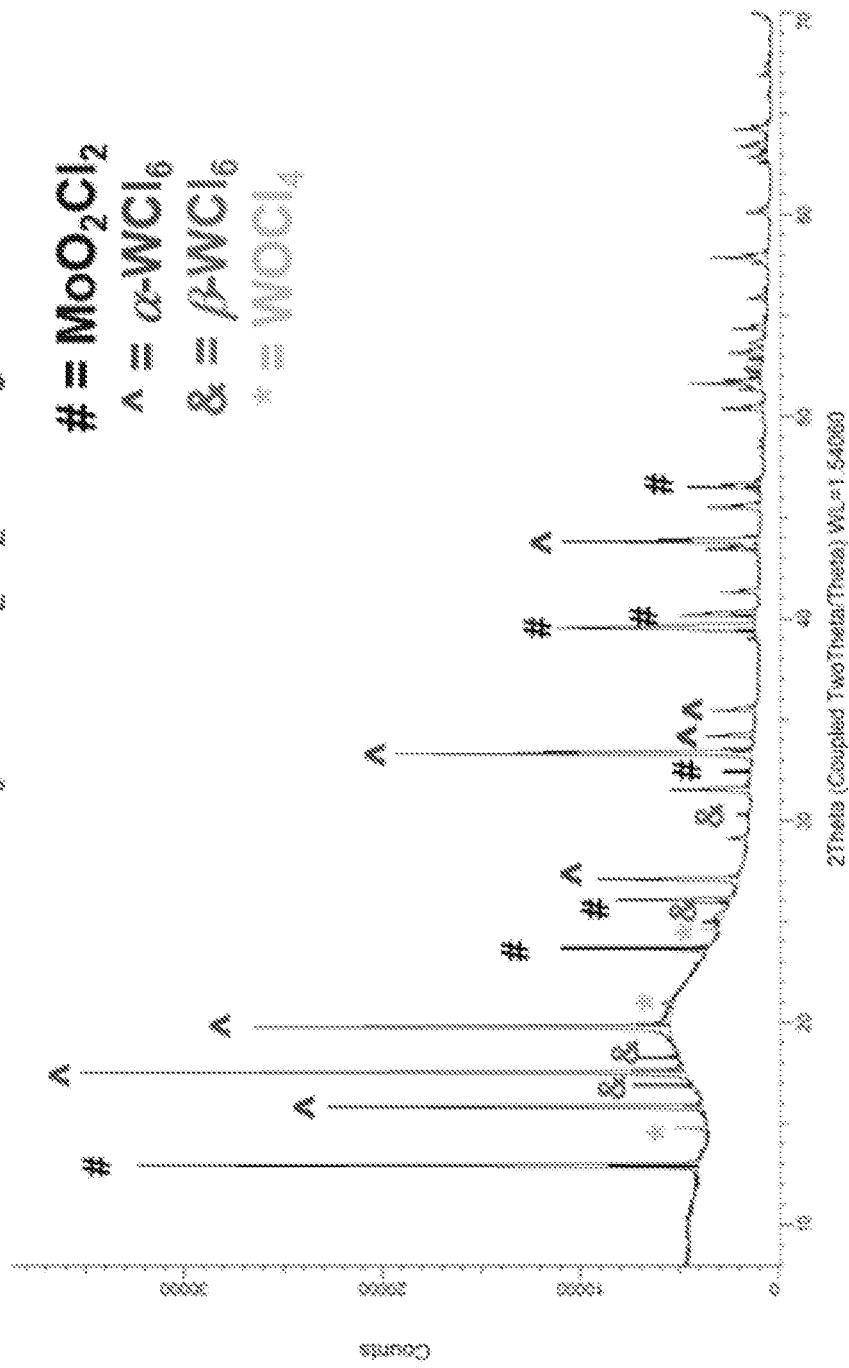
FIG. 1a is powder X-ray diffraction (PXRD) pattern and fitting of $WCl_6$ and $MoO_2Cl_2$ mixture before the reaction in accordance with an exemplary embodiment of the present invention.

Disclosed are methods of using a reagent to remove oxygen from a metal-oxo precursor (oxygen-containing metal precursor) or an intermediate film formed by deposition of the metal-oxo precursor in thin film deposition processes. The disclosed are methods of using a highly oxophilic compound as the reagent to remove oxygen from a metal-oxo precursor or an intermediate film formed by deposition of the metal-oxo precursor in ALD and CVD processes. The disclosed metal-oxo precursors include metal oxyhalide precursors. More specifically, the disclosed are methods of using a highly oxophilic compound as the reagent to remove oxygen from a metal oxyhalide precursor or an intermediate film formed by deposition of the metal oxyhalide precursor in oxyhalide-based ALD and CVD processes.

The disclosed methods include the usage of the disclosed oxophilic reagent facilitates oxygen removal from the intermediate films formed by deposition of the metal oxyhalide precursor to reduce the process temperature at which the ALD or CVD takes place to yield a metal or a metal nitride film with low oxygen content or impurity. The disclosed methods include a process of using the disclosed oxophilic reagent to remove oxygen from intermediate films or intermediate oxo-halogenated metal surfaces formed by deposition of the disclosed metal oxyhalide precursor in oxyhalide-based ALD and CVD processes, thereby reducing the temperature at which the ALD or CVD takes place to yield a metal or a metal nitride film with low oxygen content. The disclosed methods include a process of using the disclosed oxophilic reagent to remove oxygen from the disclosed metal oxyhalide precursor, thereby forming a metal halide layer deposited on a surface through ALD and CVD processes. The metal halide then may be reduced to a metal or a metal nitride film with low oxygen content by introducing a reducing agent. Furthermore, the disclosed are methods of formation of metal or metal nitride films from the metal-oxo precursors, more specifically metal oxyhalide precursors, with the usage of oxophilic reagents with or without a need of a reducing agent. The disclosed metal-oxo precursors may be metal oxyhalide precursors. Hereinafter, the metal oxyhalide precursor is used throughout the entire specification, but is not limited to. The disclosed are film forming compositions including metal oxyhalide precursors, oxophilic reagents and reducing reagents.

In order to lower the process temperature, it may be assumed that applying oxygen scavengers (herein the oxophilic reagents or compounds), the deposition of a metal film, such as Mo film, could be achieved, by facilitating the removal of oxygen, i.e., reduction by deoxygenation.

The advantages of the disclosed methods include: 1) fluorine free reactions and processes; 2) non-plasma processes or plasma processes; 3) low temperature processes, preferably deposition temperature less than 500° C.; 4) extremely low O-residue impurity, preferably <1.5% of oxygen left in the deposited film after reaction, more preferably <approximately 1% of oxygen left in the deposited film after reaction.

For oxophilicity, Kepp (Kepp, K. P., A Quantitative Scale of Oxophilicity and Thiophilicity, Inorganic Chemistry, 2016, 55, 9461) summarizes well the oxophilicity of elements in the Periodic Table. In the disclosed methods, the oxophilic reagent from those elements that have higher oxophilicity than the metal of the metal oxyhalide precursor may be chosen. To make the oxophilic reagents work in ALD/CVD process, the oxophilic reagents and their oxidized products have to be volatile to ease the delivery and removal so that no trace of those elements will be left on the surface of deposition films.

Here, the disclosed oxophilic reagent may be a volatile compound containing an element having a higher oxophilicity than the metal of the metal oxyhalide precursor.

The disclosed oxophilic reagents may be selected from transition metal-containing or main group element-containing compounds to remove, exchange, scavenge or transfer the oxygen from the metal oxyhalide precursors. The transition metal or main group element in the oxophilic reagent has a higher oxophilicity than the metal of the metal oxyhalide precursor, which may correspond to a reduction of the metal center of the metal oxyhalide precursor, or leave the oxidation state unchanged, i.e., ligand exchange.

The disclosed metal oxyhalide precursors may have a general formula

$M^{(a)}X_cO_e$, wherein M is Mo, W, V, Nb, Ta, and Cr; X is a halogen; a is the oxidation state of M and a is an integer ranging from 3 to 6; c is a number, 0<c<6; e is a number, 0<e<3; c+2e=a. Preferably X is selected from Cl, Br or I. In one embodiment, the metal oxyhalide precursor is selected from transitional metal oxyhalide precursor. Preferably, the metal oxyhalide precursor is selected from $MoO_2Cl_2$, $MoOCl_4$, $WOCl_4$, $WO_2Cl_2$, $NbOCl_3$, $TaOCl_3$, $CrO_2Cl_2$ or the like.

The disclosed oxophilic reagent may have a general formula

$N^{(b)}X_dO_f$, wherein N is a transition metal halide or oxyhalide, or a Group 14 or 15 halide, oxyhalide or oxide; X is a halogen; b is the oxidation state of N and b is an integer ranging from 3 to 6; d is a number, 0≤d<6; f is a number, 0<f<3; d+2f=b. Preferably X is selected from Cl, Br or I.

Here, oxophilicity of N in $N^{(b)}X_dO_f$ should be larger than oxophilicity of M in $M^{(a)}X_cO_e$. For example, Mo<W in oxophilicity. Thus, the oxophilic reagent $N^{(b)}X_dO_f$ is selected from the oxophilic reagent that contains an element of transition metal, or an element from the Group 14 or 15, wherein the oxophilicity of their main element (i.e., the transition metal or Groups 14 and 15 element) in the oxophilic reagents is higher than that of the metal in the metal oxyhalide precursors.

Preferably, the disclosed oxophilic reagents may be selected from;
  Group 14;
    C-containing: $CCl_4$, $CBr_4$, $COCl_2$, CO, and R—N=C=O, wherein R is a saturated or unsaturated hydrocarbon group, such as an alkyl group, preferably, R=H, Me, Et, iPr, nPr, iBu, tBu, sBu, nBu;
    Si-containing; $Si_xR_yX_z$, wherein x=1 to 5, y and z=0 to 12, y+z≤2x+2; X is a halogen selected from Cl, Br, I; R is H, a saturated or unsaturated hydrocarbon group, amino group, alkoxy group, or silyl group;
  Group 15:
    N-containing: NO, $N_2O$;
    P-containing: $PCl_3$, $PBr_3$, $PI_3$; or
    Transition metal-containing: $VCl_4$, $VCl_3$, $NbCl_5$, $TaCl_5$, $WCl_6$, $WCl_5$, $WOCl_4$, or $WCl_4$.

Alternatively, the disclosed oxophilic reagents may be Si-containing oxophilic reagents $Si_xR_yX_z$, wherein x=1 to 5, y and z=0 to 12, y+z≤2x+2; X is a halogen selected from Cl, Br, I; R is H, a saturated or unsaturated hydrocarbon group, amino group, alkoxy group, or silyl group. Exemplary Si-containing oxophilic reagents include $Si_2Cl_6$, $Si_2Cl_5H$, $Si_2Cl_4Me_2$, $Si_2ClMe_5$, $Si_2Cl_2Me_4$, $Si_2Br_6$, $Si_2Br_5H$, $Si_2Br_4Me_2$, $Si_2BrMe_5$, $Si_2Br_2Me_4$ $Si_2Br_5H$, $Si_2Me_6$, $Si_2I_6$, $Si_2I_5H$, $Si_2I_4(Me)_2$, $Si_2(OMe)_6$, $Si_2(NR_2)_6$ (wherein R=H, Me, Et), $Si_2(NMe_2)_5Cl$, $Si_3Cl_8$, $Si_3Br_8$, $Si_3I_8$, or $Si_4(Me)_9H$. Preferably, the Si-containing oxophilic reagent is $Si_2Cl_6$ (HCDS).

Alternatively, the oxophilic reagents $N^{(b)}X_dO_f$ may be selected from non-halide containing precursors (with d=0) with similar criteria as their main elements having higher oxophilicity than the metal in the metal oxyhalide precursors. Preferably, those oxophilic reagents are selected from:
  Group 14: CO, and R—N=C=O, wherein R is a saturated or unsaturated hydrocarbon group, such as an alkyl group, preferably, R=H, Me, Et, iPr, nPr, iBu, tBu, sBu, nBu; or
  Group 15: NO, $N_2O$.

Alternatively, the oxophilic reagents $N^{(b)}X_dO_f$ may be an isocyante having a formula R—N=C=O, wherein R is a saturated or unsaturated hydrocarbon group, such as an alkyl group, preferably, R=H, Me, Et, iPr, nPr, iBu, tBu, sBu, nBu. When an isocynate is used as an oxophilic reagent, the M=O bond of the metal oxyhalide precursor will be replaced by M=N—R bond, which leads to the formation of a metal nitride film rather than a pure metal film. Herein, C and N elements have higher oxophilicity than the metal in the metal oxyhalide precursor. Preferably the isocynate is tBu-N=C=O. When tBu-N=C=O is used as an oxophilic reagent, the M=O bond of the metal oxyhalide precursor will be replaced by M=N-tBu bond, which leads to the formation of a metal nitride film rather than a pure metal film.

Alternatively, the oxophilic reagent $N^{(b)}X_dO_f$ may be a transition metal halide or oxyhalide. Exemplary transition metal-containing halides or oxyhalides include $VCl_4$, $VCl_3$, $NbCl_5$, $TaCl_5$, $WCl_6$, $WCl_5$, $WOCl_4$, and $WCl_4$.

In one embodiment, a reducing agent may be used in addition to the oxophilic reagent $N^{(b)}X_dO_f$ to convert the deposited film to a metal film. The reducing agent may be $H_2$, $B_2H_6$, HCl, or the like for the formation of a metal form. The reducing agent may be $NH_3$ for the formation of a metal nitride film.

Alternatively, the oxophilic reagent itself may also act as a reducing agent capable of reducing the metal oxyhalide precursor to metal. In this case, the oxophilic reagent acts as both an oxygen scavenger and a reducing agent. For example, CO may act as both an oxygen scavenger and a reducing agent.

In general, there are three general reaction schemes or equations of oxygen removal reactions or deoxygenations from the metal oxyhalide precursor, as described below.

Equation I: Oxidation state of metals of the metal oxyhalide precursors does not change:

$$M^{(a)}X_cO_e + N^{(b)}X_dO_f \rightarrow M^{(a)}X_{c+2}O_{e-1} + N^{(b)}X_{d-2}O_{f+1} \quad (I)$$

wherein $M^{(a)}X_cO_e$ is a metal oxyhalide precursor, wherein M is Mo, W, V, Nb, Ta, and Cr; X is a halogen; a is the oxidation state of M and a is an integer ranging from 3 to 6; c is a number, $0<c<6$; e is a number, $0<e<3$; $c+2e=a$;

$N^{(b)}X_dO_f$ is an oxophilic reagent, wherein N is a transition metal halide or oxyhalide, or a Group 14 or 15 halide, oxyhalide or oxide; X is a halogen; b is the oxidation state of N and b is an integer ranging from 3 to 6; d is a number, $0 \leq d < 6$; f is a number, $0 < f < 3$; $d+2f=b$;

provided that oxophilicity of N in $N^{(b)}X_dO_f$ is larger than oxophilicity of M in $M^{(a)}X_cO_e$, and $N^{(b)}X_dO_f$ and $N^{(b)}X_{d-2}O_{f+1}$ are volatile. Preferably X is selected from Cl, Br or I.

Examples of Equation I

1) Metal oxyhalide precursor being $MoO_2Cl_2$ and oxophilic reagent being $WCl_6$, which removes oxygen in sequential steps:

$$Mo^{(VI)}Cl_2O_2 + W^{(VI)}Cl_6 \rightarrow Mo^{(VI)}Cl_4O + W^{(VI)}Cl_4O$$

$$Mo^{(VI)}Cl_4O + W^{(VI)}Cl_6 \rightarrow Mo^{(VI)}Cl_6 + W^{(VI)}Cl_4O$$

wherein $W^{(VI)}Cl_6$ and $W^{(VI)}Cl_4O$ are volatile.

2) Removing two M=O in one single step, metal oxyhalide precursor being $MoO_2Cl_2$ and oxophilic reagent being $WCl_6$:

$$Mo^{(VI)}Cl_2O_2 + 2W^{(VI)}Cl_6 \rightarrow Mo^{(VI)}Cl_6 + 2W^{(VI)}Cl_4O$$

wherein $W^{(VI)}Cl_6$ and $W^{(VI)}Cl_4O$ are volatile.

3) Reaction product $Mo^{(VI)}Cl_6$ in 1) and 2) is unstable and undergoes further reaction:

$$Mo^{(VI)}Cl_6 \rightarrow Mo^{(IV)}Cl_4 + Cl_2$$

$$Mo^{(VI)}Cl_4 + 2H_2 \rightarrow Mo^{(0)} + 4HCl$$

wherein, $Mo^{(VI)}Cl_4$ may be reduced to Mo and HCl by $H_2$, or heated to decompose to Mo and $Cl_2$.

Equation II: Oxidation state of metals in the metal oxyhalide precursor changed by two:

$$M^{(a)}X_cO_e + N^{(b)}X_dO_f \rightarrow M^{(a-2)}X_cO_{e-1} + N^{(b+2)}X_dO_{f+1} \quad (II)$$

wherein $M^{(a)}X_cO_e$ is a metal oxyhalide precursor, wherein M is Mo, W, V, Nb, Ta, and Cr; X is a halogen; a is the oxidation state of M and a is an integer ranging from 3 to 6; c is a number, $0<c<6$; e is a number, $0<e<3$; $c+2e=a$;

$N^{(b)}X_dO_f$ is an oxophilic reagent wherein N is a transition metal halide or oxyhalide, or a Group 14 or 15 halide, oxyhalide or oxide; X is a halogen; b is the oxidation state of N and b is an integer ranging from 3 to 6; d is a number, $0 \leq d < 6$; f is a number, $0 < f < 3$; $d+2f=b$;

provided that oxophilicity of N in $N^{(b)}X_dO_f$ should be larger than oxophilicity of M in $M^{(a)}X_cO_e$, and $N^{(b)}X_dO_f$ and $N^{(b+2)}X_dO_{f+1}$ are volatile. Preferably X is selected from Cl, Br or I.

Example of Equation II

Metal oxyhalide precursor being $MoO_2Cl_2$ and oxophilic reagent being $WCl_4$:

$$Mo^{(VI)}Cl_2O_2 + W^{(IV)}Cl_4 \rightarrow Mo^{(IV)}Cl_4 + W^{(VI)}Cl_2O_2$$

$$Mo^{(IV)}Cl_4 + 2H_2 \rightarrow Mo^{(0)} + 4HCl$$

wherein, $Mo^{(IV)}Cl_4$ may be reduced to Mo and HCl by $H_2$, or heated to decompose to Mo and $Cl_2$; $W^{(IV)}Cl_4$ and $W^{(VI)}Cl_2O_2$ are volatile.

Equation III: oxidation state of metals in the metal oxyhalide precursor changed by one:

$$M^{(a)}X_cO_e + N^{(b)}X_dO_f \rightarrow M^{(a-1)}X_{c+1}O_{e-1} + N^{(b+1)}X_{d-1}O_{f+1} \quad (III)$$

wherein $M^{(a)}X_cO_e$ is a metal oxyhalide precursor, wherein M is Mo, W, V, Nb, Ta, and Cr; X is a halogen; a is the oxidation state of M and a is an integer ranging from 3 to 6; c is a number, $0<c<6$; e is a number, $0<e<3$; $c+2e=a$;

$N^{(b)}X_dO_f$ is an oxophilic reagent, wherein N is a transition metal halide or oxyhalide, or a Group 14 or 15 halide, oxyhalide or oxide; X is a halogen; b is the oxidation state of N and b is an integer ranging from 3 to 6; d is a number, $0 \leq d < 6$; f is a number, $0 < f < 3$; $d+2f=b$;

provided that oxophilicity of N in $N^{(b)}X_dO_f$ should be larger than oxophilicity of M in $M^{(a)}X_cO_e$, and $N^{(b)}X_dO_f$ and $N^{(b+1)}X_{d-1}O_{f+1}$ are volatile. Preferably X is selected from Cl, Br or I.

Example of Equation III

1) Metal oxyhalide precursor being $MoO_2Cl_2$ and oxophilic reagent being $WCl_5$:

$$Mo^{(VI)}Cl_2O_2 + W^{(V)}Cl_5 \rightarrow Mo^{(V)}Cl_3O + W^{(VI)}Cl_4O$$

$$Mo^{(V)}Cl_3O + W^{(V)}Cl_5 \rightarrow Mo^{(IV)}Cl_4 + W^{(VI)}Cl_4O$$

$$Mo^{(IV)}Cl_4 + 2H_2 \rightarrow Mo^{(0)} + 4HCl$$

wherein $Mo^{(IV)}Cl_4$ may be reduced to Mo and HCl by $H_2$, or heated to decompose to Mo and $Cl_2$; $W^{(V)}Cl_5$ and $W^{(VI)}Cl_4O$ are volatile.

2) Removing two M=O, metal oxyhalide precursor being $MoO_2Cl_2$ and oxophilic reagent being $WCl_5$:

$$Mo^{(VI)}Cl_2O_2 + W^{(V)}Cl_5 \rightarrow Mo^{(V)}Cl_5 + W^{(VI)}Cl_2O_2$$

$$2Mo^{(V)}Cl_5 + 5H_2 \rightarrow 2Mo^{(0)} + 10HCl$$

wherein $Mo^{(IV)}Cl_4$ may be reduced to Mo and HCl by $H_2$, or heated to decompose to Mo and $Cl_2$; $W^{(V)}Cl_5$ and $W^{(VI)}Cl_2O_2$ are volatile.

Selection criteria for the disclosed oxophilic reagents should be that i) regarding oxophilicity, the main element (e.g., C, N, P, Si, transition metals V, W, Nb, Ta) of the oxophilic reagent should be larger than that of the metal of the metal oxyhalide precursor; and ii) the oxophilic reagent and its reaction products (e.g., M=O form products) are volatile. Table I is exemplary promising elements and their oxophilicity, volatile oxophilic reagents, and volatile oxygenated products that may be used as an oxophilic reagent either before reacting with oxygen and after reacting with oxygen in the metal oxyhalide precursors.

TABLE I

| Elements | Oxophilicity | Oxophilic Reagents and Their volatility (b.p. at ambient pressure) | Oxygenated Products and Their Volatilities (b.p. at ambient pressure) |
|---|---|---|---|
| C | 1.4 | $CCl_4$ (76.7° C.), $CBr_4$ (189.5° C.), $COCl_2$ (8.3° C.), CO (−191.5° C.), tBu—N=C=O (85° C.) | $CO_2$ (−78.5° C.) |
| Si | 0.8 | $Si_2Cl_6$ (147° C.), $Si_2(CH_3)_6$ (113° C.), $Si_2(Cl)_4(CH_3)_2$ (49° C.), $Si_3(Cl)_8$ (213° C.), $Si_4(CH_3)_9(H)$ (40° C. at 26 torr) | $Si_2OCl_6$ (137° C.), $Si_2O(CH_3)_6$ (100° C.), $Si_2OCl_4(CH_3)_2$ (138° C.) |
| V | 0.8 | $VCl_4$ (154° C.) | $VOCl_3$ (126.7° C.) |
| Nb | 0.8 | $NbCl_5$ (248.2° C.) | $NbOCl_3$ (200° C.) |
| Ta | 0.8 | $TaCl_5$ (239.4° C.) | $TaOCl_3$ (~345° C.) |
| W | 0.8 | $WCl_6$ (346.7° C.), $WCl_5$ (275.6° C.), $WCl_4$ (est. 339° C.), $WOCl_4$ (227.6° C.) | $WOCl_4$ (227.6° C.), $WO_2Cl_2$ (~450° C.) |
| N | 0.7 | NO (−152° C.), $N_2O$ (−88.5° C.) | $NO_2$ (21° C.), NO (−152° C.) |
| P | 0.7 | $PCl_3$ (76.1° C.), $PBr_3$ (173.2° C.), $PI_3$ (200° C.) | O=$PCl_3$ (105.8° C.), O=$PBr_3$ (192° C.), O=$PI_3$ (~235° C.) |
| Cr | 0.6 | $CrCl_3$ (>1000° C.) | $CrO_2Cl_2$ (117° C.) |
| Mo | 0.6 | $MoOCl_3$ (253° C.), $MoCl_5$ (268° C.) | $MoO_2Cl_2$ (Sublimation temperature: 184° C.) |

Volatility values are b.p. at ambient pressure, unless otherwise stated.
□ Referring to Gaggeler, H.W., Online Gas Chemistry Experiments with TransActinide Elements, J. Radioanal. Nucl. Chem., 1994, 183, 261-271.

Here, not all-transitional metal for the oxophilic reagent meet the selection criteria. For example, $TiCl_4$, $ZrCl_4$, $HfCl_4$, $LaCl_3$, and $CeCl_3$ do not meet the selection criteria because there is no literature report showing their oxyhalides exist and are volatile enough although their oxophilicities are much higher than Mo. Similarly, $CrCl_3$ is too nonvolatile enough to be used as an oxygen removal reagent.

In the case of silicon compounds used as an oxophilic reagent, while there are no known stable and volatile oxyhalides, the deoxygenation may happen by the formation of a siloxane compound, which may be volatile. As such, silanes, and especially polyhalo-polysilanes such as $Si_2Cl_6$ or $Si_2HCl_5$ are especially good candidates to remove O from metal oxyhalides. As such, polysilanes such as $Si_2Cl_6$, $Si_2HCl_5$, $Si_2Me_6$, are especially proper candidates to remove O from the metal oxyhalide precursors.

For example, when the metal oxyhalide precursor is $MoO_2Cl_2$, the possible oxophilic reagents containing the oxophilic elements may be selected from:

Group 14: C-containing: $CCl_4$, $CBr_4$, $COCl_2$, CO, and R—N=C=O, wherein R is a saturated or unsaturated hydrocarbon group, such as an alkyl group, preferably, R=H, Me, Et, iPr, nPr, iBu, tBu, sBu, nBu;
Si-containing: $Si_xR_yX_z$, wherein x=1 to 5, y and z=0 to 12, y+z≤2x+2; X is a halogen selected from Cl, Br, I; R is H, a saturated or unsaturated hydrocarbon group, amino group, alkoxy group, or silyl group; such as $Si_2Cl_6$, $Si_2Cl_5H$, $Si_2Cl_4Me_2$, $Si_2ClMe_5$, $Si_2Cl_2Me_4$, $Si_2Br_6$, $Si_2Br_5H$, $Si_2Br_4Me_2$, $Si_2BrMe_5$, $Si_2Br_2Me_4$ $Si_2Br_5H$, $Si_2Me_0$, $Si_2I_6$, $Si_2I_5H$, $Si_2I_4$(Me)$_2$, $Si_2$(OMe)$_6$, $Si_2$(NR$_2$)$_6$ (wherein R=H, Me, Et), $Si_2$(NMe$_2$)$_5$Cl, $Si_3Cl_8$, $Si_3Br_8$, $Si_3I_8$, or $Si_4$(Me)$_9$H;

Group 15: N-containing: NO, $N_2O$; P-containing: $PCl_3$, $PBr_3$, $PI_3$; or

Transition metal-containing: $VCl_4$, $VCl_3$, $NbCl_5$, $TaCl_5$, $WCl_6$, $WCl_5$, $WOCl_4$, $WCl_4$.

Similar approach may be applied to oxygen removal or deoxygenation applications of other metal oxyhalide precursors. For example, $CrO_2Cl_2$ is very volatile and may be used as a metal oxyhalide precursor for Cr deposition with similar process as $MoO_2Cl_2$. To that end, an oxophilic reagent may be used to facilitate a clean removal of oxygen, which may be selected from:

Group 14: $CCl_4$, $CBr_4$, $COCl_2$, CO, and R—N=C=O, wherein R is a saturated or unsaturated hydrocarbon group, such as an alkyl group, preferably, R=H, Me, Et, iPr, nPr, iBu, tBu, sBu, nBu;
$Si_xR_yX_z$, wherein x=1 to 5, y and z=0 to 12, y+z≤2x+2; X is a halogen selected from Cl, Br, I; R is H, a saturated or unsaturated hydrocarbon group, amino group, alkoxy group, or silyl group; such as $Si_2Cl_6$, $Si_2Cl_5H$, $Si_2Cl_4Me_2$, $Si_2ClMe_5$, $Si_2Cl_2Me_4$, $Si_2Br_6$, $Si_2Br_5H$, $Si_2Br_4Me_2$, $Si_2BrMe_5$, $Si_2Br_2Me_4$ $Si_2Br_5H$, $Si_2Me_6$, $Si_2I_6$, $Si_2I_5H$, $Si_2I_4$(Me)$_2$, $Si_2$(OMe)$_6$, $Si_2$(NR$_2$)$_6$ (wherein R=H, Me, Et), $Si_2$(NMe$_2$)$_5$Cl, $Si_3Cl_8$, $Si_3Br_8$, $Si_3I_8$, or $Si_4$(Me)$_8$H;

Group 15: NO, $N_2O$, $PCl_3$, $PBr_3$, $PI_3$; or

Transition metal: $VCl_4$, $VCl_3$, $NbCl_5$, $TaCl_5$, $WCl_6$, $WCl_5$, $WOCl_4$, $WCl_4$.

In a CVD or ALD process, the removal of the oxygen from the metal oxyhalide precursor or from an intermediate film formed by deposition of the metal oxyhalide precursor by the oxophilic reagent may generally be complemented by a full reduction of the metal center (metal intermediate M-X) to form a metallic film. As such, the oxophilic reagent may be used in combination with a complementary reducing reagent such as $H_2$ to convert M-X into M and HX, where X=Cl, Br or I, M=metal from the metal oxyhalide precursor. However, once the oxygen is eliminated from the film, other hydrogen reducing agents may be used, such as $AlH_3$, $AlH_3$:L (where L is a neutral ligand, such as diethylether, tetrahydrofuran, diethyl sulfide, trimethyl amine, triethyl amine, etc.), $SiH_4$, $Si_2H_6$, $B_2H_6$, $PH_3$, etc.

In order to avoid the reduction of the oxophilic reagent by the complementary reducing reagent, the process is preferentially carried out in an ALD or pulsed CVD mode, with a sequential exposure of the substrate to the metal oxyhalide precursor, the oxophilic reagent and the complementary reducing agent. The order of the sequence may be varied depending on the selected chemistry. For example, an order of the sequence may be: i) metal oxyhalide precursor (adsorption of the $M^{(a)}X_cO_e$ precursor on the substrate); ii) oxophilic reagent (reduction reaction or deoxygenation of the adsorbed metal oxyhalide precursor); iii) complementary reducing agent (reduction to metal of the metal intermediate obtained in the deoxygenation reaction). An alternative order of the sequence may be i) metal oxyhalide precursor plus the oxophilic reagent (reduction reaction or deoxygenation of the metal oxyhalide precursor); ii) addition of a complementary reducing reagent (reduction to a metal of the metal intermediate obtained in the deoxygenation reaction).

The oxophilic reagent may also play the role of the reducing agent. For instance, CO may be both an oxophilic agent (CO→$CO_2$) and a reducing reagent (CO→$COCl_2$). Similarly, $HSiCl_3$ may both remove O in the $MO_xX_y$ metal oxyhalide precursor (M is metal, X is Cl, Br or I, x and y are integers) and reduce to break M-X bonds from the metal intermediate obtained from the deoxygenation reaction through the formation of $SiCl_3$—O—$SiCl_3$ and 2 HX as by-products.

In order to form a metal nitride ($MN_x$) film, the reducing agent may be replaced by a nitride reagent, such as $NH_3$, leading to a metal nitride film. In the metal nitride film application, an alkyl or silyl isocyanate such as tertButyl isocyanate may be used as an oxophilic reagent to remove the oxygen from the metal oxyhalide. tBu-imido is bonded to the metal center of the intermediate that replaces the M=O bonds to form two tBu-imido bonds, which will lead to the metal nitride film (Equation IV),

-M=O+tBu-N=C=O→-M=N-tBu+$CO_2$ (IV)

In one embodiment, the disclosed method/process may be a CVD process. The CVD process may or may not be a plasma enhanced CVD. Preferably the CVD process is not a plasma process. More preferably the CVD is a thermal CVD.

Alternatively, the disclosed method/process may be an ALD process with a sequential exposure of the surface to reactants, such as metal oxyhalide precursor, oxophilic agent, reducing agent, where the oxophilic reagent reacts with the metal oxyhalide precursor forming a metal intermediate; the metal intermediate reacts with a complementary reducing reagent such as $H_2$ to form a pure metal film. The ALD conditions within the chamber allow the disclosed metal oxyhalide precursor adsorbed or chemisorbed on the substrate surface to react and form a film on the substrate. In some embodiments, the metal oxyhalide precursor may be plasma treated. In this case, the ALD process becomes a PEALD process. Thus, the ALD process may or may not be a plasma enhanced ALD process, preferably the ALD process is not a plasma enhanced ALD process. The ALD process may be a thermal ALD or a spatial ALD.

Alternatively, the disclosed process may be an ALD process with a sequential exposure of the surface to the reactants (precursor/oxophilic agent/reducing agent), where the oxophilic reagent forms M=N-tBu bond with M=O; the reducing reagent is selected as $NH_3$ to form a nitride film.

The disclosed metal oxyhalide precursor, oxophilic reagent and reducing agent may be introduced into the reactor either simultaneously (CVD) or sequentially (ALD).

The reactor may be purged with an inert gas (for example, $N_2$, Ar, Kr, Xe) between the introductions of the metal oxyhalide precursor, oxophilic reagent and reducing agent. Alternatively, the metal oxyhalide precursor and oxophilic reagent may be mixed together to form a metal oxyhalide precursor and oxophilic reagent mixture, and then introduced to the reactor in a mixture form. The reactor may be purged with an inert gas, such as $N_2$, Ar, Kr, Xe, between introduction of each film forming composition or a mixture of the metal oxyhalide precursor and oxophilic reagent.

Purity of the disclosed film forming composition, or the disclosed metal oxyhalides, the oxophilic reagent and reducing agent are greater than 93% w/w (i.e., 95.0% w/w to 100.0% w/w), preferably greater than 98% w/w (i.e., 98.0% w/w to 100.0% w/w), and more preferably greater than 99% w/w (i.e., 99.0% w/w to approximately 99.999% w/w or 99.0% w/w to 100.0% w/w). One of ordinary skills in the art will recognize that the purity may be determined by NMR spectroscopy and gas or liquid chromatography with mass spectrometry. The disclosed film forming compositions may contain any of the following impurities: THF; ether; pentane; cyclohexane; heptanes; benzene; toluene; halogenated metal compounds; or the like. The total quantity of these impurities is preferably below 5% w/w (i.e., 0.0% w/w to 5.0% w/w), preferably below 2% w/w (i.e., 0.0% w/w to 2.0% w/w), and more preferably below 1% w/w (i.e., 0.0% w/w to 1.0% w/w). Preferably, the water content or impurity in each of the film forming composition is less than 20 ppm by weight. The purified disclosed film forming composition may be purified by recrystallization, sublimation, distillation, and/or passing the gas liquid through a suitable adsorbent, such as 4 Å molecular sieves.

The disclosed film forming composition may be supplied either in neat form or in a blend with a suitable solvent, such as ethyl benzene, xylene, mesitylene, decalin, decane, dodecane. The disclosed metal oxyhalide precursors and the oxophilic reagents may be present in varying concentrations in the solvent.

The neat blended disclosed film forming compositions are introduced into a reactor in a vapor form by conventional means, such as tubing and/or flow meters. The vapor form may be produced by vaporizing the neat blended composition through a conventional vaporization step such as direct vaporization, distillation, by bubbling, or by using a sublimator, such as the one disclosed in PCT Publication WO2009/087609 to Xu et al. The neat blended composition may be fed in liquid state to a vaporizer where it is vaporized before it is introduced into the reactor. Alternatively, the neat blended composition may be vaporized by passing a carrier gas into a container containing the composition by bubbling the carrier gas into the composition. The carrier gas may include, but is not limited to, Ar, He, $N_2$, and mixtures thereof. Bubbling with a carrier gas may also remove any dissolved oxygen present in the neat blended composition. The carrier gas and composition are then introduced into the reactor as a vapor, If necessary, the container containing the disclosed film forming composition may be heated to a temperature that permits the composition to have a sufficient vapor pressure. The container may be maintained at temperatures in the range of, for example, approximately 0° C. to approximately 200° C. Those skilled in the art recognize that the temperature of the container may be adjusted in a known manner to control the amount of precursor vaporized.

The reactor may be any enclosure chamber within a device in which deposition methods take place such as without limitation, a parallel-plate type reactor, a cold-wall type reactor, a hot-wall type reactor, a single-wafer reactor, a multi-wafer reactor, other types of deposition systems under conditions suitable to cause the compounds to react and form the layers. One of ordinary skill in the art will recognize that any of these reactors may be used for either ALD or CVD deposition processes.

The reaction chamber may contain one or more than one substrate. For example, the reaction chamber may contain from 1 to 200 silicon wafers having from 25.4 mm to 450 mm diameters. The substrate is generally defined as the material on which a process is conducted. The substrates may be any suitable substrate used in semiconductor, photovoltaic, flat panel, LCD-TFT device manufacturing. Examples of suitable substrates include wafers, such as silicon, silica, glass, Ge, SiGe, GeSn, InGaAs, GaSb, InP, or GaAs wafers. The wafer will have multiple films or layers on it from previous manufacturing steps, including silicon-containing films or layers. The layers may or may not be patterned. For example, the wafers may include a dielectric layer. Furthermore, the wafers may include silicon layers (crystalline, amorphous, porous, etc.), silicon oxide layers, silicon nitride layers, silicon oxy nitride layers, carbon doped silicon oxide (SiCOH) layers, metal, metal oxide metal nitride layers (Ti, Ru, Ta, etc.), and combinations thereof. Additionally, the wafers may include copper layers or noble metal layers (e.g., platinum, palladium, rhodium, gold). The wafers may include barrier layers, such as manganese, manganese oxide, etc. Plastic layers, such as poly (3,4-ethylenedioxythiophene)poly(styrenesulfonate)[PEDOT:PSS] may also be used. The layers may be planar or patterned. The disclosed processes may deposit the layer directly on the wafer or directly on one or more layers on top of the wafer when patterned layers are formed on the substrate. The patterned layers may be alternating layers of two specific layers such as $In_2O_3$ and $ZrO_2$ used in 3D NAND. Furthermore, one of ordinary skill in the art will recognize that the terms "film" "layer" used herein refer to a thickness of some material laid on or spread over a surface and that the surface may be a trench a line. Throughout the specification and claims, the wafer and any associated layers thereon are referred to as substrates.

The temperature and the pressure within the reactor are held at conditions suitable for vapor depositions, such as ALD and CVD. In other words, after introduction of the vaporized disclosed film forming composition into the chamber, conditions within the chamber are such that at least part of the precursor is deposited onto the substrate to form a layer. For instance, the pressure in the reactor or the deposition pressure may be held between about $10^{-3}$ torr and about 100 torr, more preferably between about $10^{-2}$ torr and 10 torr, as required per the deposition parameters. Likewise, the temperature in the reactor or the deposition temperature may be held between about 100° C. and about 500° C., preferably between about 150° C. and about 485° C. One of ordinary skill in the art will recognize that "at least part of the precursor is deposited" means that some all of the precursor reacts with adheres to the substrate.

The temperature to achieve optimal film growth may be controlled by either controlling the temperature of the substrate holder. Devices used to heat the substrate are known in the art. The substrate is heated to a sufficient temperature to obtain the desired film at a sufficient growth rate and with desired physical state and composition. A non-limiting exemplary temperature range to which the substrate may be heated includes from approximately 50° C. to approximately 500° C. When a plasma deposition process is utilized, the deposition temperature may be less than approximately 500° C., preferably, less than approximately 400° C. Alternatively, when a thermal process is performed, the deposition temperature may range from approximately 100° C. to approximately 500° C.

Alternatively, the substrate may be heated to a sufficient temperature to obtain the desired metal film at a sufficient growth rate and with desired physical state and composition. A non-limiting exemplary temperature range to which the substrate may be heated includes from room temperature to approximately 500° C. Preferably, the temperature of the substrate remains less than or equal to 500° C.

Each pulse of the disclosed film forming composition may last for a time period ranging from about 0.001 seconds to about 120 seconds, alternatively from about 1 seconds to about 80 seconds, alternatively from about 5 seconds to about 30 seconds. The oxophilic reagent may also be pulsed into the reactor. In such embodiments, the pulse of each may last for a time period ranging from about 0.01 seconds to about 120 seconds, alternatively from about 1 seconds to about 30 seconds, alternatively from about 2 seconds to about 20 seconds. In another alternative, the vaporized film forming compositions and the oxophilic reagent may be simultaneously sprayed from different sectors of a shower head (without mixing of the composition and the reactant) under which a susceptor holding several wafers is spun (spatial ALD).

Depending on the particular process parameters, deposition may take place for a varying length of time. Generally, deposition may be allowed to continue as long as desired necessary to produce a film with the necessary properties. Typical film thicknesses may vary from several angstroms to several hundreds of microns, and typically from 1 to 100 nm, depending on the specific deposition process. The deposition process may also be performed as many times as necessary to obtain the desired film.

The disclosed methods for deposition of a metal or metal nitride film on a substrate comprises the steps of: reacting a metal oxyhalide precursor with an oxophilic reagent in a reactor containing the substrate to deoxygenate the metal oxyhalide precursor; and forming the metal or metal nitride film on the substrate through a vapor deposition process. Here, the substrate may be exposed to the metal oxyhalide precursor and the oxophilic reagent simultaneously. Alternatively, the substrate may be exposed to the metal oxyhalide precursor and the oxophilic reagent sequentially. After the step of reacting metal oxyhalide with the oxophilic reagent, the substrate may be exposed to a reducing agent sequentially to form the metal or metal nitride film.

Alternatively, the disclosed methods for deposition of a metal film on a substrate include: placing a substrate in a reactor, delivering into the reactor a vapor of a metal oxyhalide precursor, contacting/adsorbing the vapor with a surface of the substrate (and typically directing the vapor to the substrate) to form a metal oxyhalide layer on the surface of the substrate, introducing a vapor of an oxophilic reagent into the reactor to react with the metal oxyhalide on the surface of the substrate, forming a metal halide on the surface, and introducing a reducing agent to reduce the metal halide to a metal.

Alternatively, the disclosed methods for deposition of a metal film on a substrate include: placing a substrate in a reactor, delivering into the reactor a vapor of a mixture of a metal oxyhalide precursor and an oxophilic reagent, contacting/adsorbing the vapor with a surface of the substrate (and typically directing the vapor to the substrate) to form a metal oxyhalide layer on the surface of the substrate, wherein the oxyphilic reagent reacts with the metal oxyhalide on the surface of the substrate, forming a metal halide on the surface, and introducing a reducing agent to reduce the metal halide to a metal.

The disclosed methods for deposition of a metal nitride film on a substrate on a substrate include: placing a substrate in a reactor, delivering into the reactor a vapor of a metal oxyhalide precursor, contacting/adsorbing the vapor with the substrate (and typically directing the vapor to the substrate) to form a metal oxyhalide layer on the surface of the substrate, introducing a vapor of an oxophilic reagent containing a C—N bond, such as tBu-N bond, into the reactor to react with the metal oxyhalide on the surface of the substrate, forming a metal nitride halide intermediate on the surface, and introducing a reducing agent (such as $NH_3$) to reduce the metal nitride halide to a metal nitride film.

Alternatively, the disclosed methods for deposition of a metal nitride film on a substrate include: placing a substrate in a reactor, delivering into the reactor a vapor of a mixture of a metal oxyhalide precursor and an oxophilic reagent containing a C—N bond, such as tBu-N bond, contacting/adsorbing the vapor with the substrate (and typically directing the vapor to the substrate) to form a metal oxyhalide layer on the surface of the substrate, wherein the oxyphilic reagent reacts with the metal oxyhalide on the surface of the substrate, forming a metal nitride halide on the surface, and introducing a reducing agent (such as $NH_3$) to reduce the metal nitride halide to a metal nitride film.

The purity of the produced metal or metal nitride film according to the disclosed method may be >approximately 98.5%, preferably >approximately 99%, and the oxygen content or impurity in the produced metal or metal nitride film may be <1.5%, preferably <approximately 1%.

EXAMPLES

The following non-limiting examples are provided to further illustrate embodiments of the invention. However, the examples are not intended to be all inclusive and are not intended to limit the scope of the inventions described herein.

Example 1

The chemistry from condensed phases was tested to validate the concept and reactivity. In order to confirm experimentally that the reaction between the metal oxyhalide precursor and the oxophilic reagent is favorable at or below a target gas phase deposition process temperature, solid/liquid phase experiments were conducted by mixing the metal oxyhalide precursor and the oxophilic reagent and analyzing the reaction products to confirm the transfer of oxygen atoms by cleaving M=O from the metal oxyhalide precursor to the oxophilic reagent.

The results using $MoO_2Cl_2$ (CAS No.: 13637-68-8) as a test precursor and using $WCl_6$, $WCl_5$, $WCl_4$, $WOCl_4$, or $NbCl_5$ as an oxophilic reagent are summarized below. Experiments were conducted at 120-240° C. for several hours. Additionally, $MoO_3$ was tested to prove metal in its oxide form may be removed to form volatile species in a similar manner. In summary, before the reaction, analyses of a reaction mixture of $MoO_2Cl_2$ and $WCl_6$, $WCl_5$, $WCl_4$, $WOCl_4$, $NbCl_5$, $VCl_4$, $VCl_3$, $PI_3$, $Me_3SiCl$, or $HSiCl_3$, etc., respectively, showed the presence of Mo=O bond and $MCl_x$ or $MCl_{x'}$. After the reaction at elevated temperature, PXRD pattern, Raman spectrum (not shown), and GC spectrum if involved liquid reagents or products (not shown) showed complete disappearance of Mo=O bonds and $MoO_2Cl_2$, in return appearance of M=O bond, such as W=O, Nb=O bond when the oxophilic reagents such as $WCl_6$, $WCl_5$, $WOCl_4$, and $NbCl_5$ are used, or M-O-M bond, when the Si-based oxophilic reagent is used. For oxophilic reagent $WOCl_4$, less reactive and incomplete removal of Mo=O bond was observed. Higher reaction temperature (e.g., <500° C.) will drive the reaction to completion. Table II is the results using $MoO_2Cl_2$ as a metal oxyhalide precursor, and $MoO_3$ as a representative of oxides, to react with a variety of oxophilic reagents.

Figure 1B:
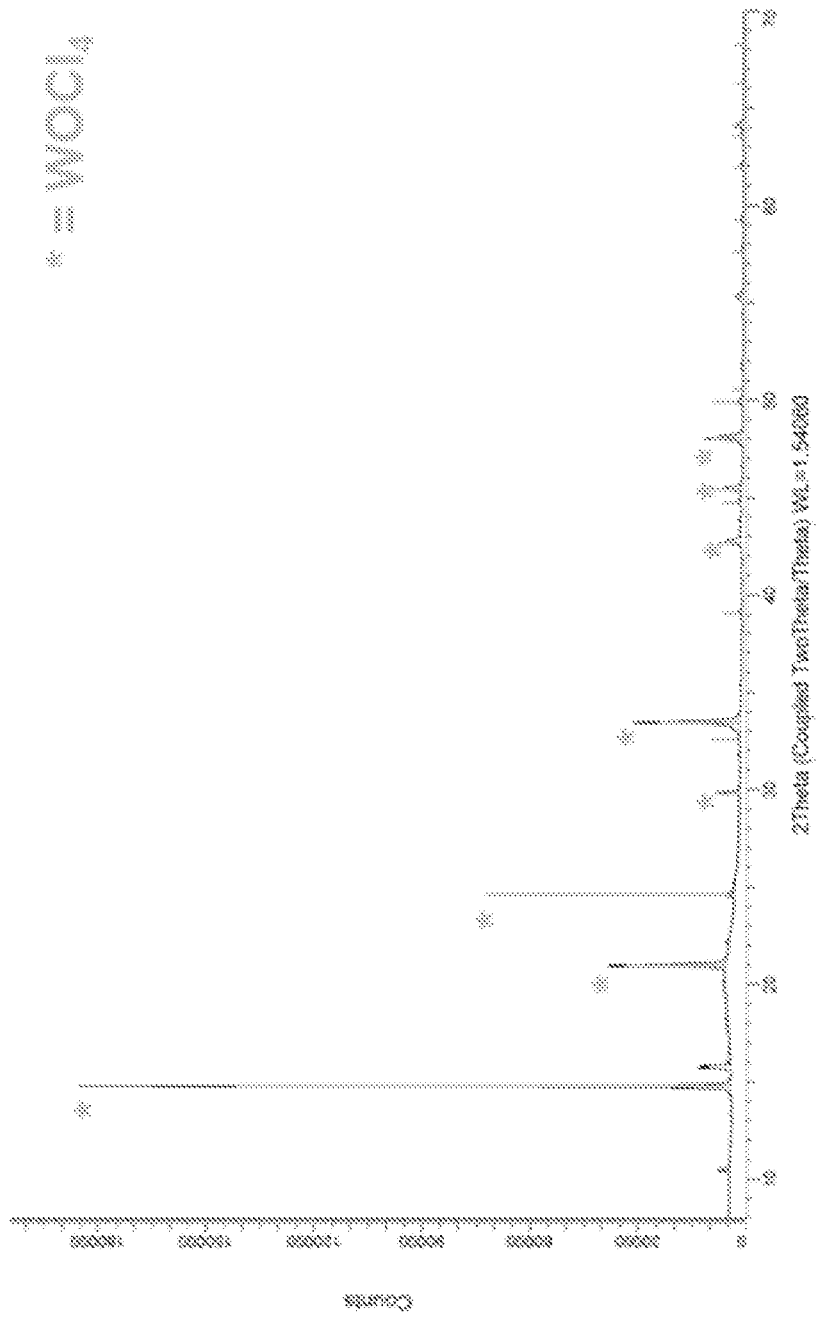
FIG. 1b is PXRD pattern and fitting of $WCl_6$ and $MoO_2Cl_2$ mixture after the reaction in accordance with an exemplary embodiment of the present invention.

FIG. 1a is powder X-ray diffraction (PXRD) pattern and fitting of $WCl_6$ and $MoO_2Cl_2$ mixture before the reaction. FIG. 1b is the PXRD pattern and fitting of 2 $WCl_6$ and $MoO_2Cl_2$ mixture after heating at 235° C. for 8 hours. By the comparison of the PXRD patterns before and after the reaction, oxygen was completely removed from $MoO_2Cl_2$ to form $MoCl_x$, and oxophilic reagent $WCl_6$ is converted into $WOCl_4$.

TABLE II

| Reaction # | Precursors | Oxophilic Reagents | Product 1 (Oxygen removed product from Precursor) | Product 2 (Oxygenated product from oxophilic reagents) | Presence of $MoO_2Cl_2$ (or $MoO_3$) in the Product | Material Characterization Method |
|---|---|---|---|---|---|---|
| 1 | $MoO_2Cl_2$ | $WCl_6$ | $MoCl_x$* | $WOCl_4$ | No | PXRD & Raman |
| 2 | $MoO_2Cl_2$ | $WCl_5$ | $MoCl_x$* | $WOCl_4$ | No | PXRD & Raman |
| 3 | $MoO_2Cl_2$ | $NbCl_5$ | $MoCl_x$* | $NbOCl_3$ | No | PXRD & Raman |
| 4 | $MoO_2Cl_2$ | $WOCl_4$ | $MoCl_x$* | $WO_2Cl_2$ | No | PXRD & Raman |
| 5 | $MoO_2Cl_2$ | $WCl_4$ | $MoCl_4$ | $WOCl_4$ | Yes | PXRD & Raman |
| 6 | $MoO_2Cl_2$ | $PI_3$ | $MoI_3$* | $POCl_3$ | No | PXRD & Raman |
| 7 | $MoO_2Cl_2$ | $VCl_4$ | $MoCl_x$* | $VOCl_x$& | No | PXRD & Raman |
| 8 | $MoO_2Cl_2$ | $VCl_3$ | $MoCl_x$* | $VO_x$ and $VOCl_2$^ | Yes | PXRD & Raman |
| 9 | $MoO_2Cl_2$ | $SiHCl_3$ | $MoOCl_3$# | siloxanes | No | PXRD & Raman & GC-MS |
| 10 | $MoO_2Cl_2$ | $SiMe_3Cl$ | $MoCl_x$* | siloxanes | No | PXRD & Raman & GC-MS |
| 11 | $MoO_3$ | $WCl_6$ | $MoCl_x$* | $WOCl_4$ | No | PXRD & Raman |
| 12 | $MoO_3$ | $WCl_5$ | $MoCl_x$* | $WOCl_4$ | No | PXRD & Raman |

TABLE II-continued

| Reaction # | Precursors | Oxophilic Reagents | Product 1 (Oxygen removed product from Precursor) | Product 2 (Oxygenated product from oxophilic reagents) | Presence of MoO$_2$Cl$_2$ (or MoO$_3$) in the Product | Material Characterization Method |
|---|---|---|---|---|---|---|
| 13 | MoO$_3$ | SiHCl$_3$ | MoOCl$_3$# | siloxanes | No | PXRD & Raman & GC-MS |
| 14 | MoO$_3$ | SiMe$_3$Cl | no reaction$^i$ | | Yes | PXRD & Raman & GC-MS |

*Identity of MoCl$_x$ and MoI$_3$ is not fully confirmed; MoCl$_6$ decomposes into MoCl$_4$ at reaction temperature.
&Identity of VOCl$_x$ is not fully confirmed, due to its instability at reaction temperature.
˙VO$_x$ is formed due to thermal decomposition of VOCl$_2$ at elevated temperature. Reaction is incomplete due to relatively low reactivity and high melting point of VCl$_3$. Increasing the reaction temperature to 350-500° C. should drive the reaction to completeness.
Reaction of MoO$_2$Cl$_2$ or MoO$_3$ with SiHCl$_3$ is carried out at 120° C., which is relatively low, resulting in partial oxygen removal from MoO$_2$Cl$_2$ or MoO$_3$ to form MoOCl$_3$. By increasing the reaction temperature, it is expected to remove oxygen from MoOCl$_3$ and leave MoCl$_x$.
$^i$Reaction of MoO$_3$ with SiMe$_3$Cl is carried out at 120° C., which is too low. By increasing the reaction temperature, it is expected to remove oxygen from MoO$_3$ and leave MoCl$_x$.

Example 2

As described above, the most challenge to reduce MoO$_2$Cl$_2$ to Mo metal is the deoxygenation step. Thus, using an oxygen removal reagent other than H$_2$ could facilitate the reduction process. Few candidates of the oxygen scavengers were considered, e.g. HCDS.

ALD of Mo using MoO$_2$Cl$_2$ below 500° C. with a first step of oxygen removal by an oxophilic reagent is represented by Equation I. A subsequent interaction of the metal oxyhalide precursor already deoxygenated reacts under low pressure condition with a second reducing reagent to deposit a Mo material (e.g., Mo layer) may be pure (e.g., at least 95, 98, 99, 99.5, or 99.9% (atomic) Mo).

Figure 2A:
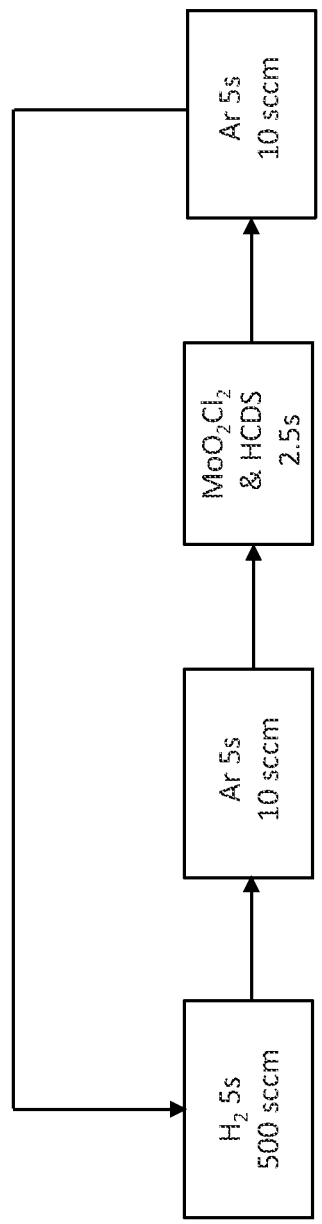
FIG. 2a is a flowchart of an ALD process with HCDS as an oxygen scavenger and $H_2$ as a reducing agent in accordance with an exemplary embodiment of the present invention.

For example, an ALD process consisting of the following conditions and sequence was carried out (T=485° C., total P=10 torr) using a SiO$_2$ substrate: A mixture of MoO$_2$Cl$_2$/HCDS (Hexachlorodisilane, Si$_2$Cl$_6$, CAS No.: 13465-77-5) pulse 2.5 sec (1.01/11.3 sccm) was flown into the reactor by using argon as a carrier gas (100 sccm), followed by argon purge 5 sec (10 sccm), H$_2$ pulse 5 sec (500 sccm) and argon purge 5 sec (10 sccm), as shown in FIG. 2a, to deposit a highly pure Mo film 98.5%. The oxygen impurity was <1.5%. The chemical reactions are expected to be as follows.

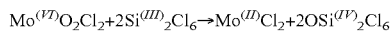

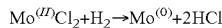

Figure 2B:
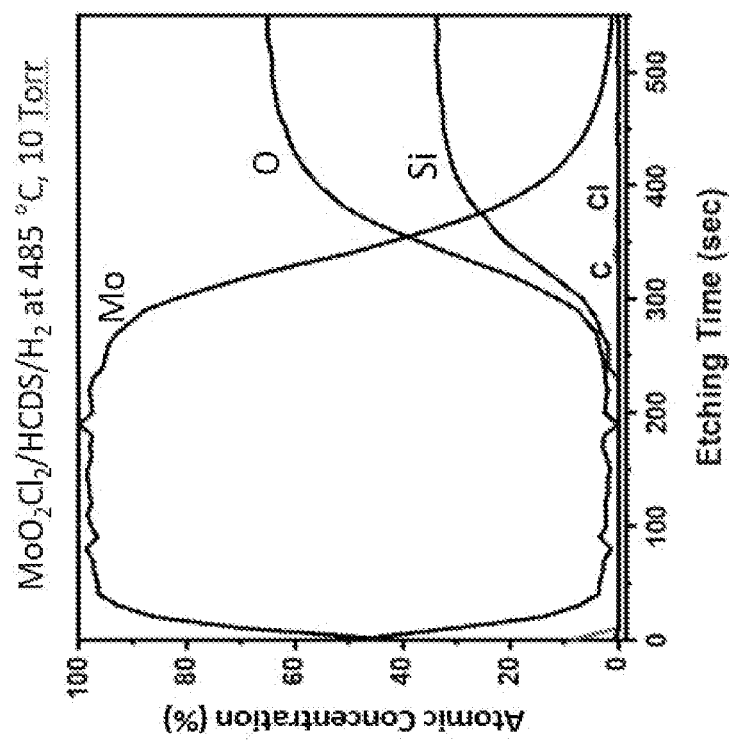
FIG. 2b is X-ray photoelectron spectroscopy (XPS) of the ALD at 485° C.
Figure 3A:
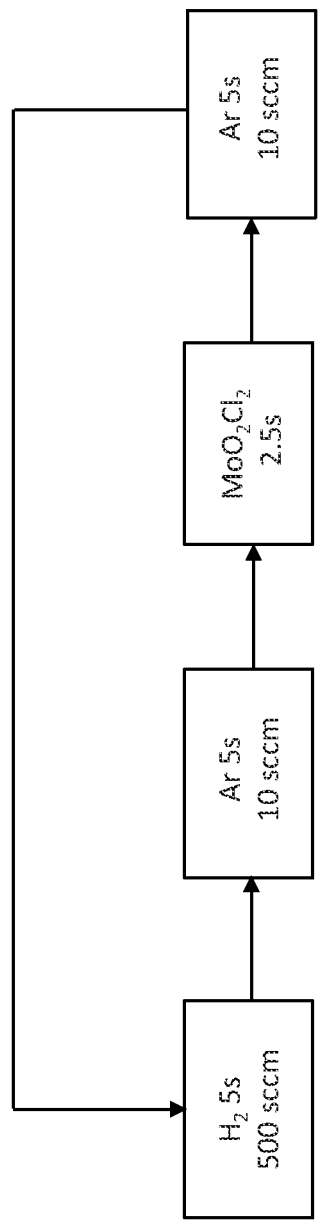
FIG. 3a is a flowchart of an ALD process with $H_2$ as a reducing agent in the absence of HCDS as oxygen scavenger in accordance with an exemplary embodiment of the present invention.
Figure 3B:
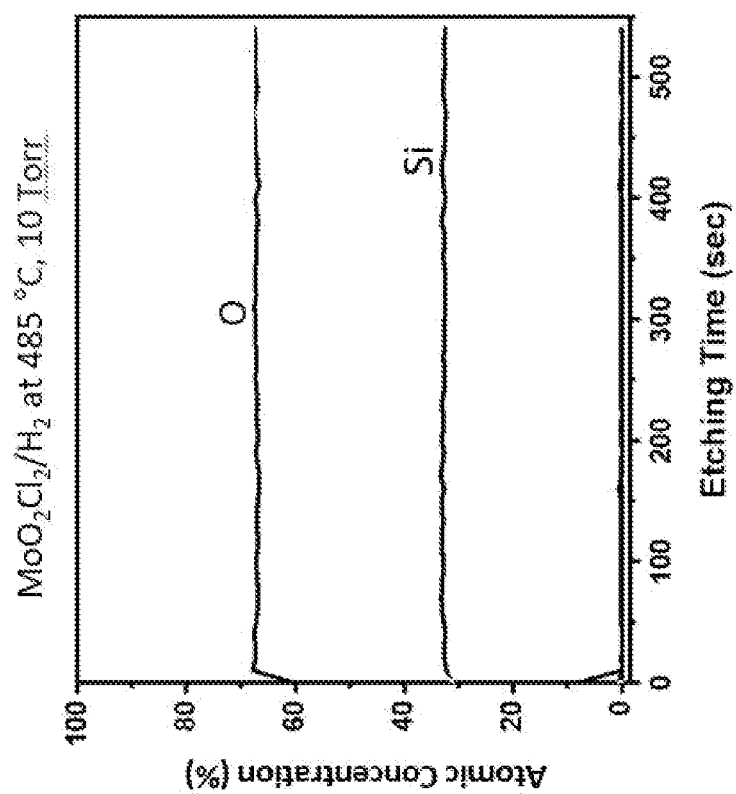
FIG. 3b is XPS of the ALD at 485° C.

FIG. 2b is X-ray photoelectron spectroscopy (XPS) of usage of HCDS as an oxygen scavenger and H$_2$ as a reducing agent.
As a counter example, the same process is carried out in the absence of HCDS under the same process conditions of T=485° C., total P=10 torr. MoO$_2$Cl$_2$ 2.5 sec (1.01 sccm), argon as carrier gas (100 sccm), argon purge 5 sec (10 sccm), H$_2$ pulse 5 sec (500 sccm) and argon purge 5 sec (10 sccm), as shown in FIG. 3a. The film characterization by XPS shows the absence of Mo and the sole presence of SiO$_2$ substrate. FIG. 3b is XPS of classical ALD with H$_2$ at 485° C. in the absence of HCDS as oxygen scavenger.

Thus, HCDS may work as an oxygen removal reagent with MoO$_2$Cl$_2$ with Ar purge and H$_2$ reduction separately. The Mo film has an ultra-high purity (Mo>98.5%, O<1.5%, Si 0%), referring to FIG. 2b, with HCDS. At the same temperature in the absence of HCDS, no Mo deposition occurs, referring to FIG. 3b.

Although the subject matter described herein may be described in the context of illustrative implementations to process one or more computing application features/operations for a computing application having user-interactive components the subject matter is not limited to these particular embodiments. Rather, the techniques described herein may be applied to any suitable type of user-interactive component execution management methods, systems, platforms, and/or apparatus.

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

While embodiments of this invention have been shown and described, modifications thereof may be made by one skilled in the art without departing from the spirit or teaching of this invention. The embodiments described herein are exemplary only and not limiting. Many variations and modifications of the composition and method are possible and within the scope of the invention. Accordingly, the scope of protection is not limited to the embodiments described herein, but is only limited by the claims which follow, the scope of which shall include all equivalents of the subject matter of the claims.

We claim:
1. A process for deposition of a metal or metal nitride film on a substrate, the process comprising
reacting a metal oxyhalide precursor with an oxophilic reagent in a reactor containing the substrate to deoxygenate the metal oxyhalide precursor;
after deoxygenation, exposing the substrate to a reducing agent sequentially; and
forming the metal or metal nitride film on the substrate through a vapor deposition process,
wherein
the metal oxyhalide precursor is M$^{(a)}$X$_c$O$_e$, wherein M is Mo, W, V, Nb, Ta, and Cr; X is a halogen selected from Cl, Br or I; a is the oxidation state of M and a is an integer ranging from 3 to 6; c is a number, 0<c<6; e is a number, 0<e<3; c+2e=a; and
the oxophilic reagent is N$^{(b)}$X$_d$O$_f$, wherein N is a transition metal halide or oxyhalide, or a Group 14 or 15 halide, oxyhalide or oxide; X is a halogen selected from Cl, Br or I; b is the oxidation state of N and b is an integer ranging from 3 to 6; d is a number, 0≤d<6; f is a number, 0<f<3; d+2f=b, wherein oxophilicity of N is higher than oxophilicity of M, wherein the oxophilic reagent and products of the oxophilic reagent are volatile.

2. The process of claim 1, further comprising
exposing the substrate to the metal oxyhalide precursor and the oxophilic reagent simultaneously.

3. The process of claim 1, further comprising
exposing the substrate to the metal oxyhalide precursor and the oxophilic reagent sequentially.

4. The process of claim 1, wherein the reducing agent is selected from $H_2$, HCl, $B_2H_6$, $NH_3$, CO, $SiHCl_3$, $SiHBr_3$, or $SiHI_3$.

5. The process of claim 1, wherein the metal oxyhalide precursor is selected from $MoO_2Cl_2$, $MoOCl_4$, $WOCl_4$, $WO_2Cl_2$, $NbOCl_3$, $TaOCl_3$, and $CrO_2Cl_2$.

6. The process of claim 1, wherein the oxophilic reagent is selected from:
 a. Group 14-containing: $CCl_4$; $CBr_4$; $COCl_2$; CO; R—N=C=O, wherein R is H, or an alkyl group selected from H, Me, Et, iPr, nPr, iBu, tBu, sBu, nBu; or $Si_xR_yX_z$, wherein x=1 to 5, y and z=0 to 12, y+z≤2x+2, X is a halogen selected from Cl, Br, I, R is H, a saturated or unsaturated hydrocarbon group, amino group, alkoxy group, or silyl group;
 b. Group 15-containing: NO, $N_2O$, $PCl_3$, $PBr_3$, $PI_3$; or
 c. Transition metal-containing: $VCl_4$, $VCl_3$, $NbCl_5$, $TaCl_5$, $WCl_6$, $WCl_5$, $WOCl_4$, or $WCl_4$.

7. The process of claim 1, wherein the oxophilic reagent is a Si-containing oxophilic reagent having a general formula: $Si_xR_yX_z$, wherein x=1 to 5, y and z=0 to 12, y+z≤2x+2; X is a halogen selected from Cl, Br, I; R is H, a saturated or unsaturated hydrocarbon group, amino group, alkoxy group, or silyl group.

8. The process of claim 7, wherein the Si-containing oxophilic reagent is selected from $Si_2Cl_6$, $Si_2Cl_5H$, $Si_2Cl_4Me_2$, $Si_2ClMe_5$, $Si_2Cl_2Me_4$, $Si_2Br_6$, $Si_2Br_5H$, $Si_2Br_4Me_2$, $Si_2BrMe_5$, $Si_2Br_2Me_4$ $Si_2Br_5H$, $Si_2Me_6$, $Si_2I_6$, $Si_2I_5H$, $Si_2I_4(Me)_2$, $Si_2(OMe)_6$, $Si_2(NR_2)_6$ (wherein R=H, Me, Et), $Si_2(NMe_2)_5Cl$, $Si_3Cl_8$, $Si_3Br_8$, $Si_3I_8$, or $Si_4(Me)_9H$.

9. The process of claim 1, wherein the oxophilic reagent is $Si_2Cl_6$.

10. The process of claim 1, wherein the oxophilic reagent is R—N=C=O, wherein R is H, or an alkyl group selected from H, Me, Et, iPr, nPr, iBu, tBu, sBu, nBu, which leads to form the metal nitride film.

11. The process of claim 1, wherein the oxophilic reagent is a metal halide or metal oxyhalide selected from $VCl_4$, $VCl_3$, $NbCl_5$, $TaCl_5$, $WCl_6$, $WCl_5$, $WOCl_4$, or $WCl_4$.

12. The process of claim 1, wherein a deposition temperature of the vapor deposition process is less than 485° C.

13. The process of claim 1, wherein an oxygen impurity in the metal or metal nitride film is less than approximately 1%.

14. The process of claim 1, wherein the vapor deposition process is a thermal CVD or ALD, or a plasma enhanced CVD or ALD.

15. A process for removing oxygen from a metal oxyhalide precursor or an intermediate film deposited by the metal oxyhalide precursor to form a metal or metal nitride film on a surface, the process comprising
reacting the metal oxyhalide precursor or the intermediate film deposited by the metal oxyhalide precursor with an oxophilic reagent to form a metal intermediate; and
reducing the metal intermediate to a metal or metal nitride film on the surface by a reducing agent through a vapor deposition process,
wherein
the metal oxyhalide precursor is $M^{(a)}X_cO_e$, wherein M is Mo, W, V, Nb, Ta, and Cr; X is a halogen selected from Cl, Br or I; a is the oxidation state of M and a is an integer ranging from 3 to 6; c is a number, 0<c<6; e is a number, 0<e<3; c+2e=a; and
the oxophilic reagent is $N^{(b)}X_dO_f$, wherein N is a transition metal halide or oxyhalide, or a Group 14 or 15 halide, oxyhalide or oxide; X is a halogen selected from Cl, Br or I; b is the oxidation state of N and b is an integer ranging from 3 to 6; d is a number, 0≤d<6; f is a number, 0<f<3; d+2f=b,
wherein oxophilicity of N is higher than oxophilicity of M,
wherein the oxophilic reagent and products of the oxophilic reagent are volatile.

16. The process of claim 15, wherein
the metal oxyhalide precursor is selected from $MoO_2Cl_2$, $MoOCl_4$, $WOCl_4$, $WO_2Cl_2$, $NbOCl_3$, $TaOCl_3$, and $CrO_2Cl_2$; and
the oxophilic reagent is selected from:
 a. Group 14-containing: $CCl_4$; $CBr_4$; $COCl_2$; CO; R—N=C=O, wherein R is H, or an alkyl group selected from H, Me, Et, iPr, nPr, iBu, tBu, sBu, nBu; or $Si_xR_yX_z$, wherein x=1 to 5, y and z=0 to 12, y+z≤2x+2, X is a halogen selected from Cl, Br, I, R is H, a saturated or unsaturated hydrocarbon group, amino group, alkoxy group, or silyl group;
 b. Group 15-containing: NO, $N_2O$, $PCl_3$, $PBr_3$, $PI_3$; or
 c. Transition metal-containing: $VCl_4$, $VCl_3$, $NbCl_5$, $TaCl_5$, $WCl_6$, $WCl_5$, $WOCl_4$, or $WCl_4$.

17. The process of claim 15, wherein an oxygen impurity in the metal or metal nitride film is less than approximately 1%.

18. The process of claim 15, wherein the vapor deposition process is a thermal CVD or ALD, or a plasma enhanced CVD or ALD at a deposition temperature less than 485° C.

19. A reagent for deoxygenation of a metal oxyhalide precursor or an intermediate film deposited by the metal oxyhalide precursor to form a metal or metal nitride film in a vapor deposition process, the metal oxyhalide precursor being $MoO_2Cl_2$, the reagent comprising:
an oxophilic reagent selected from $Si_2Cl_6$, $WCl_6$, $WCl_5$, $WOCl_4$, $NbCl_5$, $VCl_4$, $PI_3$, $SiMe_3Cl$, or $SiHCl_3$,
wherein the oxophilic reagent and deoxygenation products of the oxophilic reagent are volatile.

* * * * *